(12) United States Patent
Kato et al.

(10) Patent No.: US 9,580,802 B2
(45) Date of Patent: Feb. 28, 2017

(54) FILM FORMATION METHOD AND APPARATUS FOR SEMICONDUCTOR PROCESS

(71) Applicant: TOKYO ELECTRON LIMITED, Tokyo (JP)

(72) Inventors: Hitoshi Kato, Iwate (JP); Kohichi Orito, Iwate (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/644,703

(22) Filed: Mar. 11, 2015

(65) Prior Publication Data

US 2015/0184293 A1    Jul. 2, 2015

Related U.S. Application Data

(62) Division of application No. 12/871,342, filed on Aug. 30, 2010, now abandoned.

(30) Foreign Application Priority Data

Sep. 1, 2009  (JP) .................................. 2009-202016

(51) Int. Cl.
*C23C 16/455*    (2006.01)
*C23C 16/40*    (2006.01)
(Continued)

(52) U.S. Cl.
CPC .......... *C23C 16/455* (2013.01); *C23C 16/402* (2013.01); *C23C 16/4554* (2013.01);
(Continued)

(58) Field of Classification Search
None
See application file for complete search history.

(56) References Cited

U.S. PATENT DOCUMENTS 3,241,939 A    3/1966  Michalik
3,351,451 A    11/1967 Barradell-Smith et al.
(Continued)

FOREIGN PATENT DOCUMENTS

JP    7-122506 A    5/1995
JP    8-162449      6/1996
(Continued)

*Primary Examiner* — Mandy Louie
(74) *Attorney, Agent, or Firm* — Oblon, McClelland, Maier & Neustadt, L.L.P.

(57) ABSTRACT

A film formation method performs a supply cycle of sequentially supplying two kinds of reactive gases inside a vacuum container to form a thin film on the substrate. The method includes placing the substrate, including a depressed portion formed thereon, on a table, then adjusting a temperature of the substrate to a temperature at which a first reactive gas is adsorbed and condensed, then supplying the first reactive gas and thereby depositing a condensed substance of the first reactive gas on the substrate, then rotating the table, then partly vaporizing the condensed substance by supplying a heated gas to the substrate; and then supplying a second reactive gas in an activated state to the substrate and thereby causing the second reactive gas to react with the condensed substance.

9 Claims, 18 Drawing Sheets

(51) Int. Cl.
    *C23C 16/48*     (2006.01)
    *C23C 16/54*     (2006.01)
    *H01L 21/02*     (2006.01)
    *H01L 21/762*     (2006.01)

(52) U.S. Cl.
    CPC .. *C23C 16/45548* (2013.01); *C23C 16/45551* (2013.01); *C23C 16/481* (2013.01); *C23C 16/54* (2013.01); *H01L 21/0228* (2013.01); *H01L 21/0234* (2013.01); *H01L 21/02164* (2013.01); *H01L 21/02219* (2013.01); *H01L 21/02222* (2013.01); *H01L 21/02274* (2013.01); *H01L 21/76224* (2013.01)

(56) References Cited

U.S. PATENT DOCUMENTS

| | | | |
|---|---|---|---|
| 5,062,386 A | 11/1991 | Christensen | |
| 5,338,362 A | 8/1994 | Imahashi | |
| 5,620,559 A | 4/1997 | Kikuchi | |
| 6,022,412 A | 2/2000 | Vincenzo et al. | |
| 6,444,041 B2 | 9/2002 | Vaartstra | |
| 6,769,629 B2 * | 8/2004 | Hwang | C23C 16/45544 118/715 |
| 7,153,542 B2 | 12/2006 | Nguyen et al. | |
| 8,058,179 B1 * | 11/2011 | Draeger | H01L 21/02164 156/345.26 |
| 8,357,434 B1 * | 1/2013 | Choi | H01L 21/0338 427/249.1 |
| 2003/0100193 A1 * | 5/2003 | Joo | C23C 16/308 438/778 |
| 2004/0026374 A1 | 2/2004 | Nguyen et al. | |
| 2004/0187784 A1 | 9/2004 | Sferlazzo | |
| 2006/0073276 A1 * | 4/2006 | Antonissen | C23C 16/4412 427/248.1 |
| 2006/0177579 A1 | 8/2006 | Shin et al. | |
| 2007/0095286 A1 | 5/2007 | Baek et al. | |
| 2007/0161180 A1 * | 7/2007 | Erben | C23C 16/34 438/243 |
| 2007/0215036 A1 * | 9/2007 | Park | C23C 16/45551 117/88 |
| 2007/0218702 A1 * | 9/2007 | Shimizu | C23C 16/06 438/758 |
| 2008/0017841 A1 | 1/2008 | Lee et al. | |
| 2008/0081104 A1 | 4/2008 | Hasebe et al. | |
| 2008/0193643 A1 | 8/2008 | Dip | |
| 2008/0214012 A1 | 9/2008 | Park et al. | |
| 2011/0220147 A1 | 9/2011 | Schreiber et al. | |

FOREIGN PATENT DOCUMENTS

| | | |
|---|---|---|
| JP | 2003-100642 A | 4/2003 |
| JP | 2004-47644 | 2/2004 |

\* cited by examiner

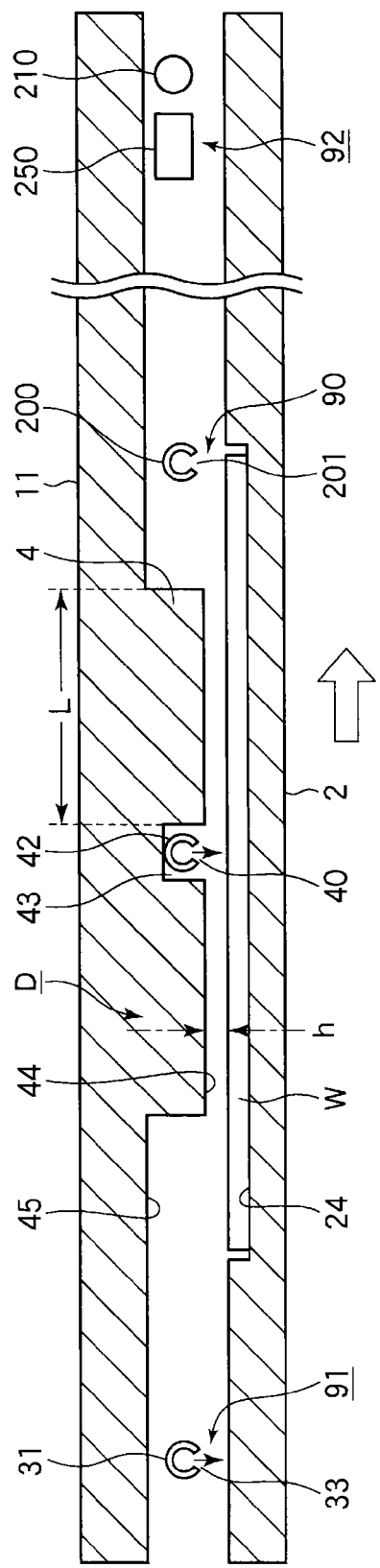
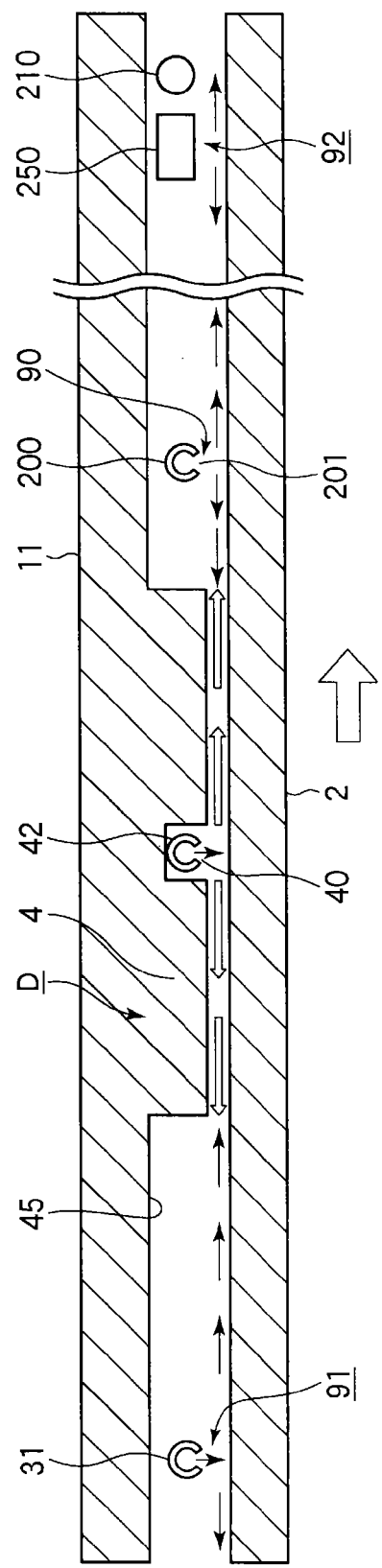

FILM FORMATION METHOD AND APPARATUS FOR SEMICONDUCTOR PROCESS

CROSS-REFERENCE TO RELATED PATENT APPLICATIONS

This application is a divisional application of and claims the benefit of priority under 35 U.S.C. §120 from U.S. application Ser. No. 12/871,342, filed Aug. 30, 2010, which is based upon and claims the benefit of priority under 35 U.S.C. §119 from Japanese Patent Application No. 2009-202016, filed on Sep. 1, 2009 in the Japan Patent Office, the entire contents of each of which is incorporated herein by reference.

BACKGROUND OF THE INVENTION

1. Field of the Invention

The present invention relates to a film formation apparatus for a semiconductor process for forming a thin film on a target object, such as a semiconductor wafer, inside a vacuum container by use of at least two reactive gases of different types. The term "semiconductor process" used herein includes various kinds of processes which are performed to manufacture a semiconductor device or a structure having wiring layers, electrodes, and the like to be connected to a semiconductor device, on a target object, such as a semiconductor wafer or a glass substrate used for an FPD (Flat Panel Display), e.g., an LCD (Liquid Crystal Display), by forming semiconductor layers, insulating layers, and conductive layers in predetermined patterns on the target object.

2. Description of the Related Art

Owing to the demands of increased miniaturization of patterns used in semiconductor devices, it has become more important to form embedded structures of high quality inside depressed portions in the patterns. For example, in order to provide device isolation areas on a semiconductor wafer, various techniques have been proposed concerning an STI (shallow trench isolation) structure, which includes a trench formed in the wafer and an insulating film embedded in the trench. As regards techniques of this kind, it has become more difficult to provide films good in filling performance as well as film quality, along with the increased miniaturization of patterns. In the present circumstance, oxide films formed by a combination of a PSZ (polysilazane) film coating method and an HDP (high density plasma) method are widely used as embedded films of this kind. However, where a CVD (chemical vapor deposition) method, such as the HDP method, is used, voids are easily generated at overlap portions of films deposited on the sidewall of a trench. Consequently, problems arise such that deterioration in film quality, such as an increase in etching rate, is caused, and deposition in deep trenches is difficult. Further, along with the increased miniaturization of patterns, fluctuation of the shape of resist masks influences more on the shape of depressed portions, and may cause depressed portions to have a reversely taper shape that is wider toward the bottom. Where a depressed portion has a high aspect ratio and a reversely taper shape together, it is particularly difficult to embed a film therein.

U.S. Pat. No. 7,153,542 discloses an apparatus configured to rotate a table with a wafer placed thereon relative to a gas supply section, while sequentially supplying different reactive gases onto the wafer, to perform film formation cycles including a plasma process and a thermal process. Jpn. Pat. Appln. KOKAI Publication No. 8-162449 discloses a film formation method utilizing liquid phase epitaxy for improving characteristics for embedding a film, along with repetition of plasma irradiation and thermal annealing for improving the film quality. Jpn. Pat. Appln. KOKAI Publication No. 2004-47644 discloses a technique for forming an oxide film by liquefying TEOS gas on the substrate and then supplying oxygen gas under heating.

BRIEF SUMMARY OF THE INVENTION

An object of the present invention is to provide a film formation apparatus for a semiconductor process, which can well perform embedding of a film in a depressed portion of a target object.

According to a first aspect of the present invention, there is provided a film formation apparatus for a semiconductor process for forming a thin film on a target object by use of first and second reactive gases, the apparatus comprising: a vacuum container; an exhaust system configured to exhaust gas from inside the vacuum container; a rotary table disposed inside the vacuum container and configured to place the target object thereon; a rotating mechanism configured to rotate the rotary table; a temperature adjusting mechanism configured to set the target object on the rotary table to a temperature at which the first reactive gas is condensed; a first reactive gas supply section disposed inside the vacuum container and configured to supply the first reactive gas onto the target object on the rotary table to adsorb a condensed substance of the first reactive gas onto the target object; a vaporizing section disposed inside the vacuum container and configured to heat the target object on the rotary table to partly vaporize the condensed substance; and a second reactive gas supply section disposed inside the vacuum container and configured to supply the second reactive gas in an activated state onto the target object on the rotary table and to cause the second reactive gas to react with the condensed substance to form a reaction product, wherein the first reactive gas supply section, the vaporizing section, and the second reactive gas supply section are disposed in this order in a rotational direction of the rotary table.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIGS. 3A and 3B are sectional side views each showing process areas and a separation area inside the film formation apparatus;

DETAILED DESCRIPTION OF THE INVENTION

Figure 1:
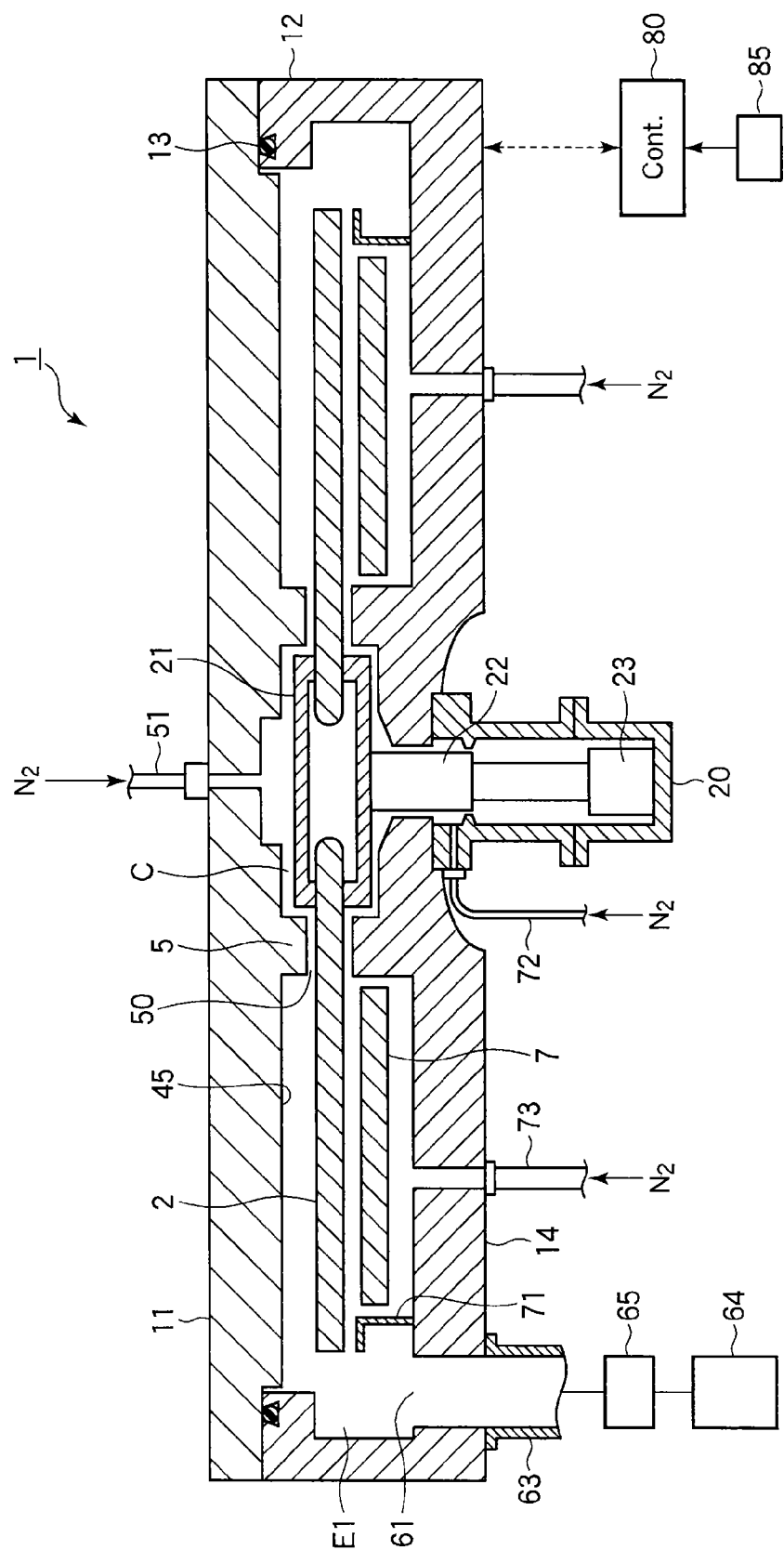
FIG. 1 is a sectional side view showing a film formation apparatus according to a first embodiment of the present invention.

Embodiments of the present invention will now be described with reference to the accompanying drawings. In the following description, the constituent elements having substantially the same function and arrangement are denoted by the same reference numerals, and a repetitive description will be made only when necessary.

First Embodiment

Figure 2:
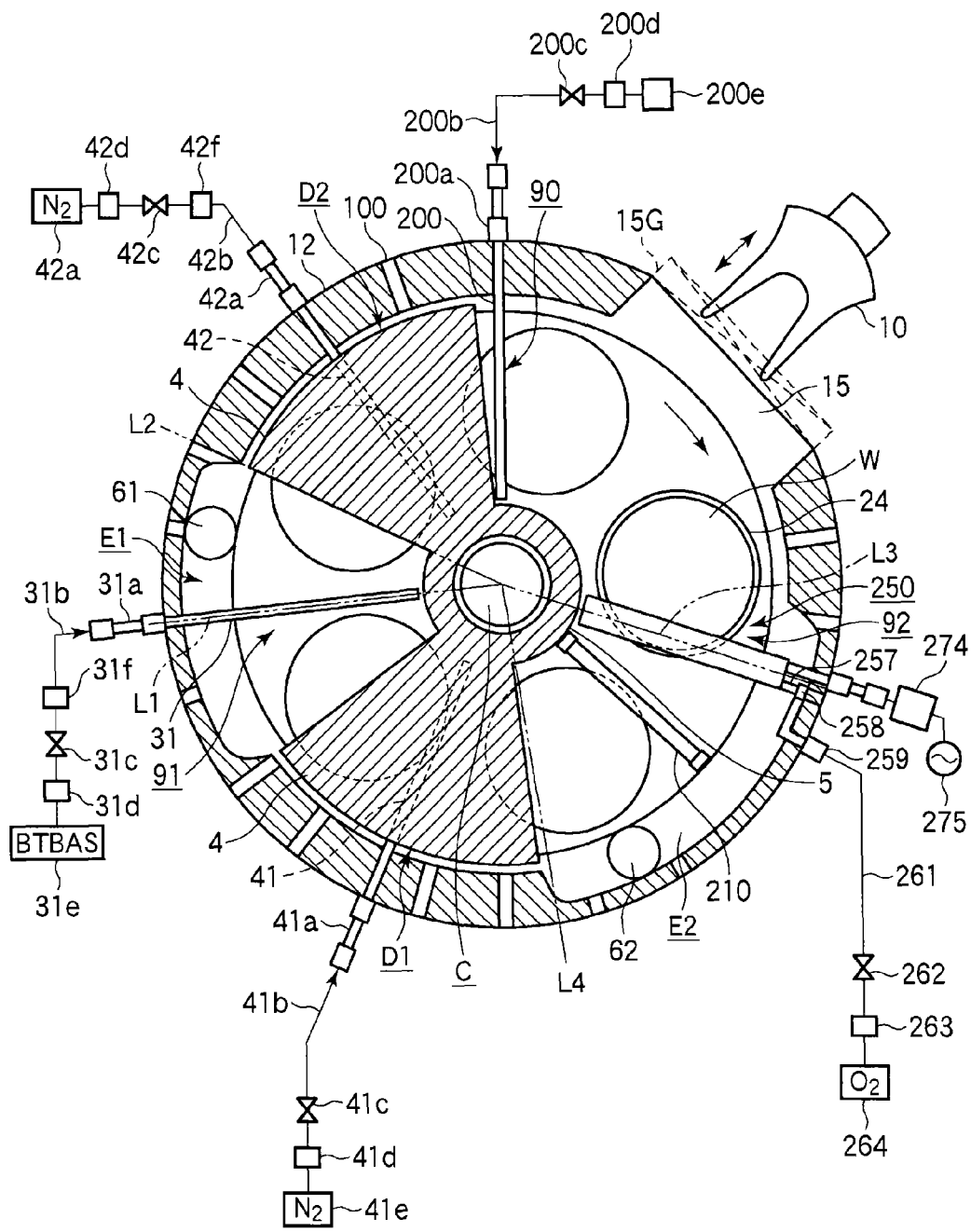
FIG. 2 is a sectional plan view showing the film formation apparatus.

As shown in FIGS. 1 and 2, the film formation apparatus according to the first embodiment of the present invention includes a flat vacuum container 1 having an essentially circular shape in the plan view, and a horizontal rotary table 2 disposed inside the vacuum container 1 and having a rotational center at the center of the vacuum container 1. The vacuum container 1 includes container main body 12 like a cup containing the rotary table 2 and a circular top plate 11 that airtightly closes the upper opening of the container main body 12. A seal member having a ring shape, such as an O-ring 13, is disposed on the periphery of the upper opening of the container main body 12, so that the top plate 11 is airtightly connected to the container main body 12. The top plate 11 can be moved up and down by a drive mechanism (not shown) when it is opened and closed.

The rotary table 2 is attached at the center to a core portion 21 having a circular cylindrical shape. The core portion 21 is fixed at the top of the rotary shaft 22 extending in the vertical direction. The rotary shaft 22 extends through the bottom plate 14 of the vacuum container 1, and is connected at the bottom to a rotating mechanism or drive member 23 that rotates the rotary shaft 22, clockwise in this embodiment, about a vertical axis. The rotary shaft 22 and drive member 23 are contained in a cylindrical casing 20 opened at the top. The casing 20 has a flange at the top, which is airtightly attached to the lower surface of the bottom plate 14 of the vacuum container 1, to ensure the airtight state between the atmospheres inside and outside the casing 20.

The rotary table 2 has a plurality of, such as five, circular dimples 24 formed on the upper face side by side in a rotational direction (annular direction), as shown in FIG. 2, wherein each of dimples 24 is configured to place a substrate or semiconductor wafer (which may be simply referred to as "wafer") W. Accordingly, when the rotary table 2 is rotated, the dimples 24 are moved around a vertical axis serving as the center, which is the rotational center of the rotary table 2. Each of the dimples 24 is equipped with a plurality of, such as three, lifter pins 16 (see FIG. 10) for supporting the back side of a wafer W and moving the wafer W up and down, as described later, and thus has through-holes formed in the bottom, through which the lifter pins 16 extend. FIGS. 3A and 3B are sectional side views each showing the top plate 11 of the vacuum container 11 and the rotary table 2 in a development elevation, which is taken along a coaxial circular line about the rotational center.

Figure 4:
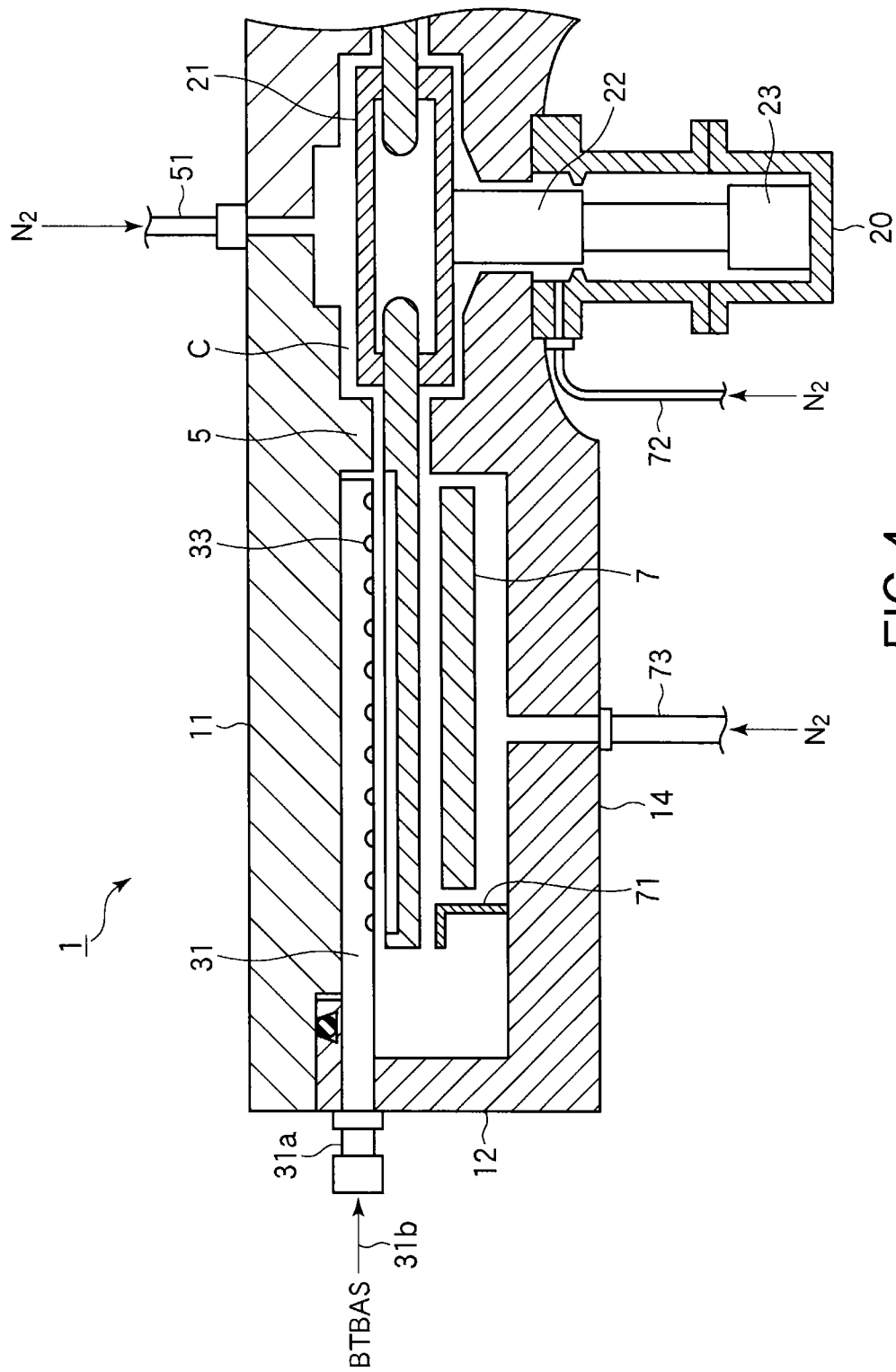
FIG. 4 is an enlarged sectional side view showing the film formation apparatus.

As shown in FIGS. 2 to 4, a reactive gas nozzle 31, two separation gas nozzles 41 and 42, and an auxiliary gas nozzle 200, which are made of, e.g., quartz, are disposed inside the vacuum container 1 at intervals in the annular direction (the rotational direction of the rotary table 2) directly above the respective areas where the dimples 24 of the rotary table 2 pass through. In this embodiment, the first separation gas nozzle 41, reactive gas nozzle 31, second separation gas nozzle 42, and auxiliary gas nozzle 200 are arrayed in this order clockwise (in the rotational direction of the rotary table 2) from a transfer port 15 described later. These nozzles 41, 31, 42, and 200 are attached to the sidewall of the vacuum container 1 such that they are arrayed in this order in the rotational direction from a position almost opposite to the transfer port 15 to a position immediately upstream of the transfer port 15. For example, the reactive gas nozzle 31, auxiliary gas nozzle 200 and separation gas nozzles 41 and 42 horizontally and linearly extend above the wafers W from the sidewall of the vacuum container 1 toward the rotational center of the rotary table 2. These nozzles respectively include gas introducing portions 31a, 200a, 41a, and 42a at the proximal ends attached outside the sidewall of the vacuum container 1.

The reactive gas nozzle 31 and auxiliary gas nozzle 200 are part of first reactive gas supply means and auxiliary gas supply means, respectively, and the separation gas nozzles 41 and 42 are part of separation gas supply means. The nozzles 31, 200, 41, and 42 are attached to through-holes 100 formed in the sidewall of the vacuum container 1 at a plurality of positions. Through-holes 100, to which the nozzles 31, 200, 41, and 42 are not attached, are airtightly closed by cover members (not shown).

The reactive gas nozzle 31 is supplied with a first reactive gas, such as BTBAS (bistertialbutylamino silane) gas from a gas source 31e through a gas supply line 31b equipped with a valve 31c and a flow rate regulator 31d. The auxiliary gas nozzle 200 is supplied with an auxiliary gas from an auxiliary gas source 200e through a gas supply line 200b equipped with a valve 200c and a flow rate regulator 200d.

As described later, the auxiliary gas is a gas for transforming a condensed substance of the reactive gas (BTBAS gas) adsorbed on the wafers W into an intermediate product that is less volatile than the condensed substance. The less volatile intermediate product is a product containing a hydroxyl group (OH group) and/or moisture. For example, the auxiliary gas is a gas containing a hydroxyl group (OH group), such as an alcohol (R—OH, R: alkyl group), or purified water ($H_2O$) or hydrogen peroxide solution ($H_2O_2$). In this embodiment, ethanol ($C_2H_5OH$) gas is supplied as the auxiliary gas.

The first separation gas nozzle 41 is supplied with a separation gas, such as $N_2$ gas (nitrogen gas), from a gas source 41e through a gas supply line 41b equipped with a valve 41c and a flow rate regulator 41d. The second separation gas nozzle 42 is supplied with a separation gas, such as $N_2$ gas (nitrogen gas), from a gas source 42e through a gas supply line 42b equipped with a valve 42c and a flow rate regulator 42d. The gas supply line 42b is further equipped with a heating portion 42f, so that the $N_2$ gas is heated to a predetermined temperature by the heating portion 42f while it is supplied into the second separation gas nozzle 42. Thus, the second separation gas nozzle 42 (second separation gas supply means) also serves as heating means for heating the wafers W to partly vaporize the condensed substance of the reactive gas (BTBAS gas) adsorbed on the wafers W, as described later. In order to partly vaporize the condensed substance adsorbed on the wafers W, the wafers W are preferably heated to a temperature of, e.g., 85° C. to 150° C. In this case, the $N_2$ gas heated to a temperature of 100° C. to 200° C. by the heating portion 42f is supplied from the second separation gas nozzle 42 into the vacuum container 1.

In this embodiment, the gas supply line 31b to the reactive gas nozzle 31 is also equipped with a heating portion 31f. The first reactive gas or BTBAS gas is heated by the heating portion to a temperature higher than that of the wafers W placed on the rotary table 2 and is supplied into the vacuum container 1 in a gaseous phase.

As shown in FIGS. 3A, 3B, and 4, the reactive gas nozzle 31 has a plurality of gas delivery holes 33 formed therein and facing right below to deliver the reactive gas downward. The gas delivery holes 33 have a bore diameter of e.g., 0.5 mm and are arrayed at regular intervals, such as 10 mm, over the nozzle longitudinal direction (a radial direction of the rotary table 2). The auxiliary gas nozzle 200 has a plurality of gas delivery holes 201 formed therein and facing right below to deliver the auxiliary gas downward. The gas delivery holes 201 have a bore diameter of e.g., 0.5 mm and are arrayed at regular intervals, such as 10 mm, over the nozzle longitudinal direction (a radial direction of the rotary table 2). Each of the separation gas nozzles 41 and 42 has a plurality of gas delivery holes 40 formed therein and facing right below to deliver the separation gas downward. The gas delivery holes 40 have a bore diameter of e.g., 0.5 mm and are arrayed at regular intervals, such as 10 mm, over the nozzle longitudinal direction (a radial direction of the rotary table 2).

The vertical distance between the gas delivery holes 33 of the reactive gas nozzle 31 and the wafers W is set at a value of, e.g., 1 to 4 mm, and preferably of 2 mm. The vertical distance between the gas delivery holes 201 of the auxiliary gas nozzle 200 and the wafers W is set at a value of, e.g., 1 to 4 mm, and preferably of 2 mm. The vertical distance between the gas delivery holes 40 of the separation gas nozzles 41 and 42 and the wafers W is set at a value of, e.g., 1 to 4 mm, and preferably of 3 mm. The area below the reactive gas nozzle 31 is a first process area 91 (first reactive gas supply section) for adsorbing the BTBAS gas on the wafers W. The area below the auxiliary gas nozzle 200 is an auxiliary area 90 (auxiliary gas supply section) for causing the ethanol gas to react with BTBAS condensed on the wafers W to generate the intermediate product. The area below the second separation gas nozzle 42 is a heating area.

Between the auxiliary gas nozzle 200 and first separation gas nozzle 41 in the rotational direction of the rotary table 2, a plasma injector 250 and a heating lamp 210 are arrayed in this order toward the downstream side in the rotational direction.

Figure 5:
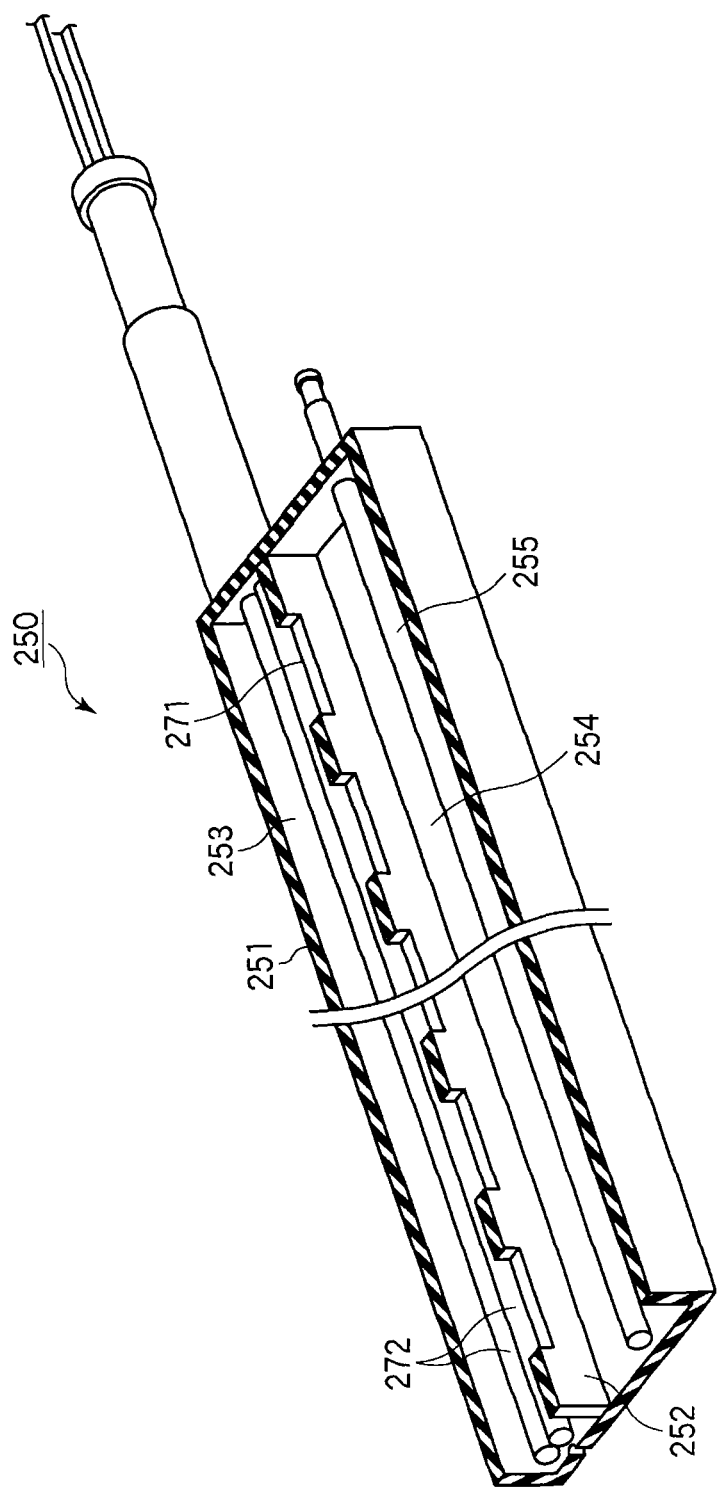
FIG. 5 is a perspective view showing a plasma injector used in the film formation apparatus.
Figure 6:
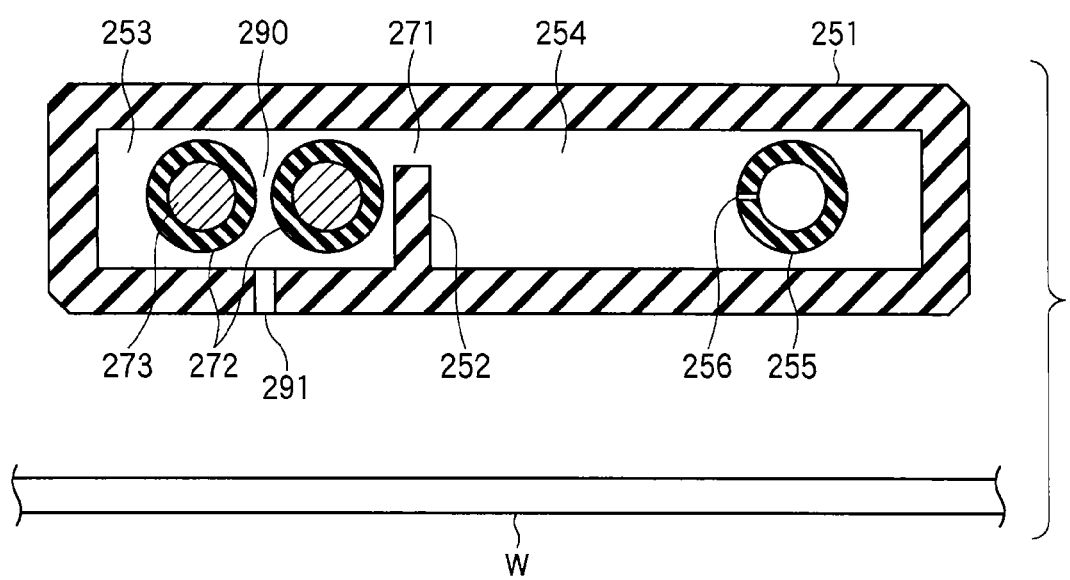
FIG. 6 is a sectional side view showing the plasma injector.

The plasma injector 250 is part of second reactive gas supply means for activating the second reactive gas and supplying it onto the wafers W. The area below the plasma injector 250 is a second process area 92 (second reactive gas supply section) for supplying the second reactive gas or oxygen ($O_2$) gas onto the wafers W. The plasma injector 250 includes an injector main body 251 formed of a casing extending in a radial direction of the rotary table 2. As shown in FIGS. 5 and 6, the injector main body 251 defines therein two spaces having different widths and partitioned by a partition wall 252 extending in its longitudinal direction. One of them is a gas activating passage or gas activating cell 253 for turning the second reactive gas into plasma (activation). The other of them is a gas introducing passage or gas introducing cell 254 for supplying a plasma generation gas into the gas activating cell 253.

FIGS. 2, 5, and 6 further show a gas supply nozzle 255, gas holes 256, a gas introducing portion 257, a connection line 258, and a coupler 259. The plasma generation gas is supplied from the gas holes 256 of the gas supply nozzle 255 into the gas introducing cell 254, and the gas flows through slots 271 formed in the partition wall 252 into the gas activating cell 253. In the gas activating cell 253, two sheath pipes 272 made of a dielectric material, such as a ceramic, extend along the partition wall 252 from the proximal end to the distal end of the gas activating cell 253. Each of the sheath pipes 272 envelops rod electrode 273 inserted therein. The proximal ends of the electrodes 273 are led out of the injector main body 251 and are connected to an RF (radio frequency) power supply 275 through a matching unit 274 outside the vacuum container 1. The injector main body 251 has gas delivery holes 291 formed on its bottom and arrayed in the longitudinal direction of the injector main body 251, so that plasma generated in the plasma generation area 290 including the electrodes 273 is delivered downward through the gas delivery holes 291. The injector main body 251 extends in a radial direction of the rotary table 2 such that its distal end reaches a position close to the center of the rotary table 2.

FIG. 2 further shows a gas supply line 261 for supplying the second reactive gas, such as oxygen ($O_2$) gas, into the gas supply nozzle 255, wherein the gas supply line 261 is connected to a gas source 264 of the $O_2$ gas through a valve 262 and a flow rate regulator 263. In this embodiment, the second reactive gas serves as the plasma generation gas as well.

Figure 7:
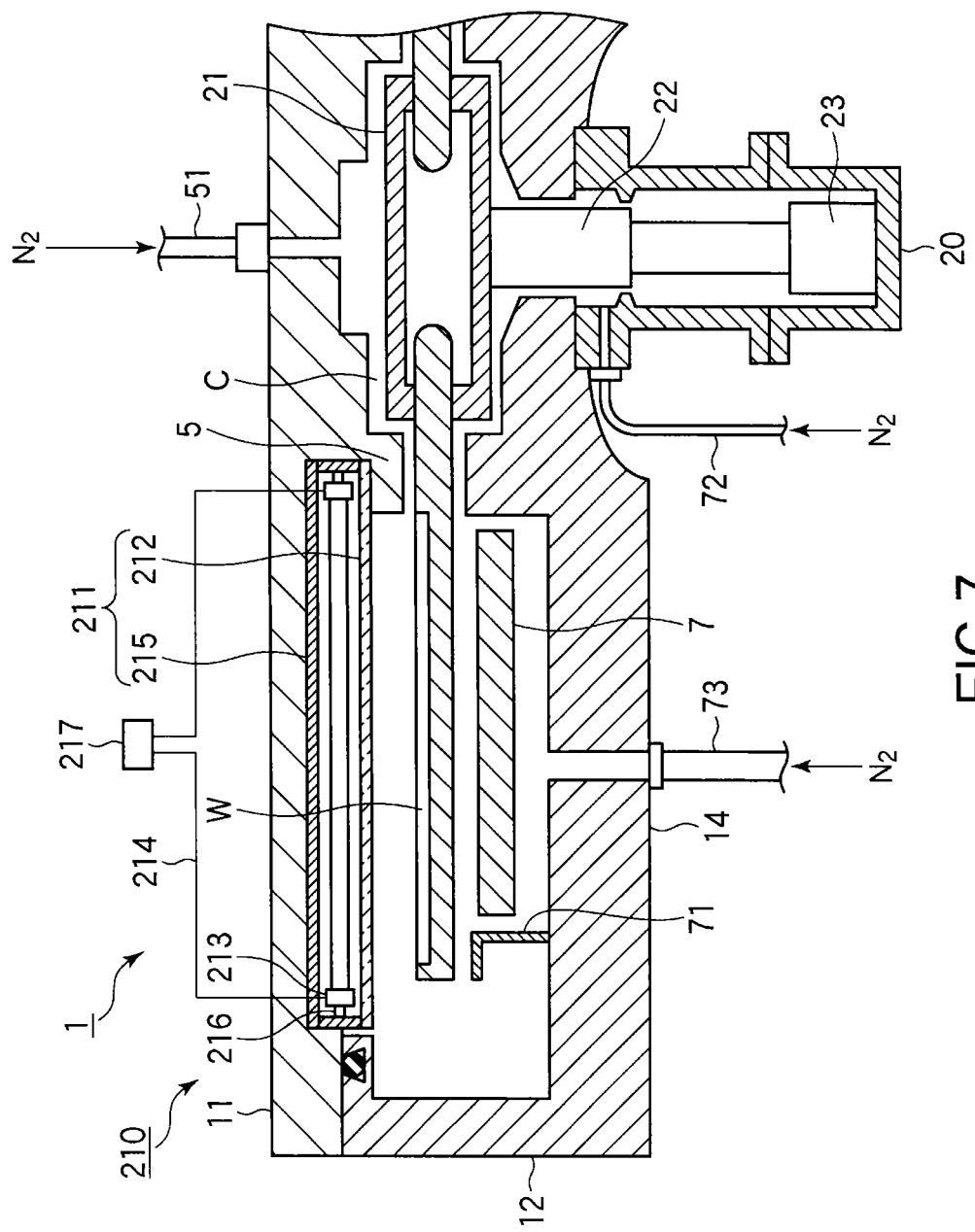
FIG. 7 is an enlarged sectional side view showing the film formation apparatus.

The heating lamp 210 extends in a radial direction of the rotary table 2 and is used as annealing heater. For example, as shown in FIG. 7, the heating lamp 210 is formed of a long cylindrical infrared lamp contained in a lamp house 211, which is disposed on the top plate 11 of the vacuum container 1 and extending in a radial direction of the rotary table 2. The lamp house 211 is provided with a reflector on the upper side, and a light-transmission window 212 on the lower side, which airtightly separates the atmosphere inside the lamp house 211 from the atmosphere inside the vacuum container 1. The heating lamp 210 has seal members 213 serving as electrodes as well at opposite ends, which are respectively connected to electric supply lines 214 extending from above the top plate 11 of the vacuum container 1, for example. FIG. 7 further shows a power supply 217 for supplying electricity to the heating lamp 210 through the electric supply lines 214 and seal members 213, and support members 216 that support the heating lamp 210 from the opposite sides. The heating lamp 210 is controlled in accordance with results of measurement performed by a temperature detector (not shown), such as a thermocouple, to heat the wafers W to a temperature of, e.g., 100° C. to 450° C., and preferably of 350° C., suitable for performing a heating process (compacting process), as described later.

Back to the explanation on the first and second separation gas nozzles 41 and 42, as shown in FIG. 2, the first separation gas nozzle 41 provides a first separation area D1, at a position upstream of the first process area 91 in the rotational direction, for separating the first process area 91 from the second process area 92 and auxiliary area 90. The second separation gas nozzle 42 provides a second separation area D2, at a position downstream of the first process area 91 in the rotational direction, for separating the first process area 91 from the auxiliary area 90 and second process area 92.

As shown in FIGS. 2, 3A, and 3B, each of the separation areas D1 and D2 includes a projecting part 4 projecting downward from the top plate 11 of the vacuum container 1, wherein the projecting part 4 has a sector shape in the plan view, which is formed by cutting the circle defined by the sidewall of the vacuum container 1 by two radial lines extending from the rotational center of the rotary table 2. Each of the separation gas nozzles 41 and 42 is disposed in a groove 43 formed on the projecting part 4 at its center in the annular direction and extending in a radial direction. The distances from the central axis of the separation gas nozzle 41 (42) to the opposite ends of the sector shape of the projecting part 4 (the upstream and downstream ends in the rotational direction of the rotary table 2) are set to be the same. In other words, in this embodiment, the groove 43 is formed to divide the projecting part 4 into tow equal parts. In another embodiment, the groove 43 may be formed such that the surface area of the projecting part 4 upstream of the groove 43 is large than that downstream of the groove 43 in the rotational direction of the rotary table 2.

As described above, each of the separation gas nozzles 41 and 42 is sandwiched by flat and low ceiling surfaces 44 (first ceiling surfaces), which are part of the lower surface of the projecting part 4, in the rotational direction. Further, the ceiling surfaces 44 are sandwiched by ceiling surfaces 45 (second ceiling surfaces), which are higher than the ceiling surfaces 44, in the rotational direction. The projecting part 4 is conceived to provide a separation gap having a small thickness between the projecting part 4 and rotary table 2, which serves to prevent the reactive gas and auxiliary gas from flowing therein and to prevent the gases from being mixed, so as to attain separation of gas atmospheres.

For example, in the case of the first separation gas nozzle 41, the separation gap prevents the ethanol gas and $O_2$ gas from entering from the upstream side in the rotational direction of the rotary table 2, and also prevents the BTBAS gas from entering from the downstream side in the rotational direction. In this embodiment, the effect of preventing gases from entering is obtained such that the separation gas or $N_2$ gas delivered from the separation gas nozzle 41 is diffused in the gap between the first ceiling surfaces 44 and rotary table 2 and is blown into the adjacent spaces below the second ceiling surfaces 45 adjacent to the first ceiling surfaces 44 to prevent gases from entering from the adjacent spaces. However, "separation of gas atmospheres" means not only a case where gases cannot at all enter the separation gap from the adjacent spaces on the opposite sides, but also a case the gases can slightly enter the separation gap but each of the gases cannot at all flow into the other side adjacent space. For example, in the case of the first process area 91, it is essential that the BTBAS gas is not mixed with the ethanol gas and $O_2$ gas in this area. As long as such an effect is ensured, the separation areas D1 and D2 can be said that they provide their necessary separation functions to separate the atmosphere of the first process area 91 and the atmosphere of the second process area 92 (and the atmosphere of the auxiliary area 90) from each other. In this embodiment, the dimensions (thickness, surface area, and so forth) of the separation gap having a small thickness are set such that the pressure difference between the separation areas D1 and D2 and the adjacent spaces is large enough to provide the effect of preventing gases from entering. In order to attain a sufficient separation function, the thickness of the separation gap (the position of the lower surface of the projecting part 4) has to be adjusted in accordance with the surface area of the projecting part 4 and other factors. It should be noted that separation of gas atmospheres means separation of substances present in gaseous atmospheres, as a matter of course, because substances derived from the gases and adsorbed or condensed on the wafers W have to pass through the separation areas D1 and D2.

As the separation gas or purge gas, an inert gas, such argon (Ar) gas or helium (He) gas, may be used in place of nitrogen ($N_2$) gas serving as an inactive gas. In place of such an inactive gas, hydrogen ($H_2$) gas may be used. Unless the film formation process is adversely affected, the separation gas or purge gas is not limited to a specific one. For example, the second separation gas nozzle 42 may be arranged to supply a heated inactive gas, such as Ar gas, or heated $H_2$ gas to partly vaporize the BTBAS gas condensed substance adsorbed on the wafers W.

The lower surface of the top plate 11 further includes an annular protrusion 5 formed at a position outside the core portion 21 of the rotary table 2 and extending along the periphery of the core portion 21. The annular protrusion 5 is continuous to portions of the projecting parts 4 close to the rotational center of the rotary table 2. The lower surface of the annular protrusion 5 is level with the lower surface of the projecting parts 4 (ceiling surfaces 44). FIG. 2 is a sectional plan view showing the apparatus taken along a horizontal line extending through the top plate 11 at a position lower than the ceiling surfaces 45 and higher than the separation gas nozzles 41 and 42. The annular protrusion 5 may be formed not integrally with the projecting parts 4 but separately from the projecting parts 4.

Figure 8:
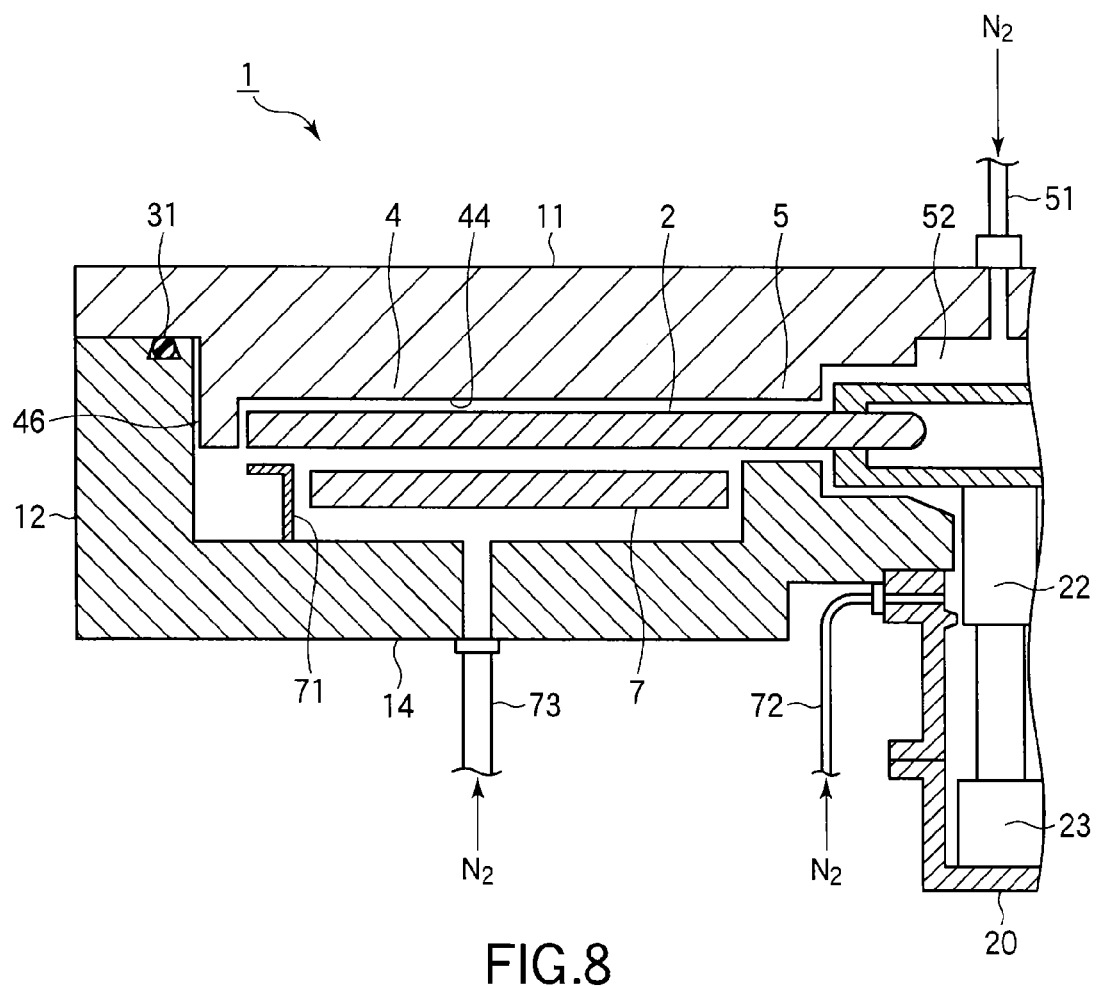
FIG. 8 is an enlarged sectional side view showing the film formation apparatus.

As described above, the lower surface of the top plate 11 of the vacuum container 1 comprises the first ceiling surfaces 44 and the second ceiling surfaces 45 higher than the ceiling surfaces 44, which are arrayed in the annular direction and are present as the ceiling surfaces facing the wafer mount places (dimples 24) of the rotary table 2. FIG. 1 shows a cross section of an area having the higher ceiling surface 45. FIG. 8 shows a cross section of an area having the lower ceiling surface 44. As shown in FIGS. 2 and 8, the peripheral portion of each of the sector-shaped projecting parts 4 (a portion of the vacuum container 1 near the outer end) forms an L-shaped bent portion 46 that faces the outer end face of the rotary table 2. Since the sector-shaped projecting parts 4 are formed on the top plate 11, which can be detached from the container main body 12, there is a small gap between the outer peripheral surface of the bent portion 46 and the container main body 12. The respective bent portions 46 are also conceived to prevent the BTBAS gas, ethanol gas, and $O_2$ gas from entering from both sides and to prevent them from being mixed, as in the projecting parts 4. The gap between the inner peripheral surface of each bent portion 46 and the outer end face of the rotary table 2 and the gap between the outer peripheral surface of the bent portion 46 and the container main body 12 are set to be the same as the height "h" of the ceiling surfaces 44 relative to the surface of the rotary table 2. In this embodiment, the inner peripheral surface of the respective bent portions 46 is deemed to form an inner peripheral wall of the vacuum container 1, when viewed from the surface area of the rotary table 2.

As shown in FIG. 8, in the separation areas D1 and D2, the inner peripheral wall of the container main body 12 forms a vertical surface close to the outer peripheral surface of the bent portions 46. As shown in FIG. 1, in the areas other than the separation areas D1 and D2, the inner peripheral wall of the container main body 12 is recessed outward, in a rectangular cross sectional shape, from a position facing the outer end face of the rotary table 2 to a position facing the bottom plate 14, for example. The areas including these recessed portions and communicating with the first process area 91 and second process area 92 are respectively called a first exhaust area E1 and a second exhaust area E2. As shown in FIGS. 1 and 2, the first exhaust area E1 and second exhaust area E2 respectively have a first exhaust port 61 and a second exhaust port 62 at the bottom. As shown in FIG. 1, the first exhaust port 61 and second exhaust port 62 are connected to vacuum exhaust means, such as a vacuum pump 64, through an exhaust passage 63 equipped with a valve 65.

The exhaust ports 61 and 62 are respectively located near the separation areas D2 and D1 in the rotational direction, so that the separation functions of the separation areas D1 and D2 work reliably. Specifically, the first exhaust port 61 is formed between the first process area 91 and second separation area D2 at a position outside the rotary table 2. The second exhaust port 62 is formed between the second process area 92 and first separation area D1 at a position outside the rotary table 2. The first exhaust port 61 is dedicated to exhaust of the first reactive gas or BTBAS gas, while the second exhaust port 62 is dedicated to exhaust of the second reactive gas or $O_2$ gas and the ethanol gas.

In this embodiment, the first exhaust port 61 is present between the reactive gas nozzle 31 and the extension of the adjacent side of the second separation area D2. The second exhaust port 62 is present between the plasma injector 250 and the extension of the adjacent side of the first separation area D1. In other words, the first exhaust port 61 is present between a straight line L1 (shown with a single-dashed chain line in FIG. 2) extending through the center of the rotary table 2 and the first process area 91 and a straight line L2 extending through the center of the rotary table 2 and the upstream side of the second separation area D2. The second exhaust port 62 is present between a straight line L3 (shown with a double-dashed chain line in FIG. 2) extending through the center of the rotary table 2 and the second process area 92 and a straight line L4 extending through the center of the rotary table 2 and the upstream side of the first separation area D1.

In this embodiment, since no separation area D is present between the auxiliary area 90 and second process area 92, the ethanol gas and the $O_2$ gas are mixed with each other, until they reach the exhaust port 62. This mixing of these gases does not adversely affect the film formation characteristics.

The number of positions having an exhaust port is not limited to 2. For example, a third exhaust port may be further formed between the second separation area D2 and auxiliary gas nozzle 200. An exhaust port may be formed between the auxiliary gas nozzle 200 and plasma injector 250. A separation area D may be defined between the auxiliary gas nozzle 200 and plasma injector 250. The number of positions having an exhaust port may be 4 or more. In this embodiment, the exhaust ports 61 and 62 are formed at a position lower than the rotary table 2, so that gas is exhausted through the gap between the inner peripheral wall of the vacuum container 1 and the peripheral edge of the rotary table 2. However, the exhaust ports 61 and 62 may be formed in the sidewall of the vacuum container 1 in place of the bottom of the vacuum container 1.

Where the exhaust ports 61 and 62 are formed in the sidewall of the vacuum container 1, they may be located at positions higher than the rotary table 2. In this embodiment, since the exhaust ports 61 and 62 are formed as shown in the drawings, gas on the rotary table 2 flows outward from the rotary table 2, and particles are less floated or scattered, as compared to a case where gas is exhausted from a ceiling surface facing the rotary table 2.

Figure 9:
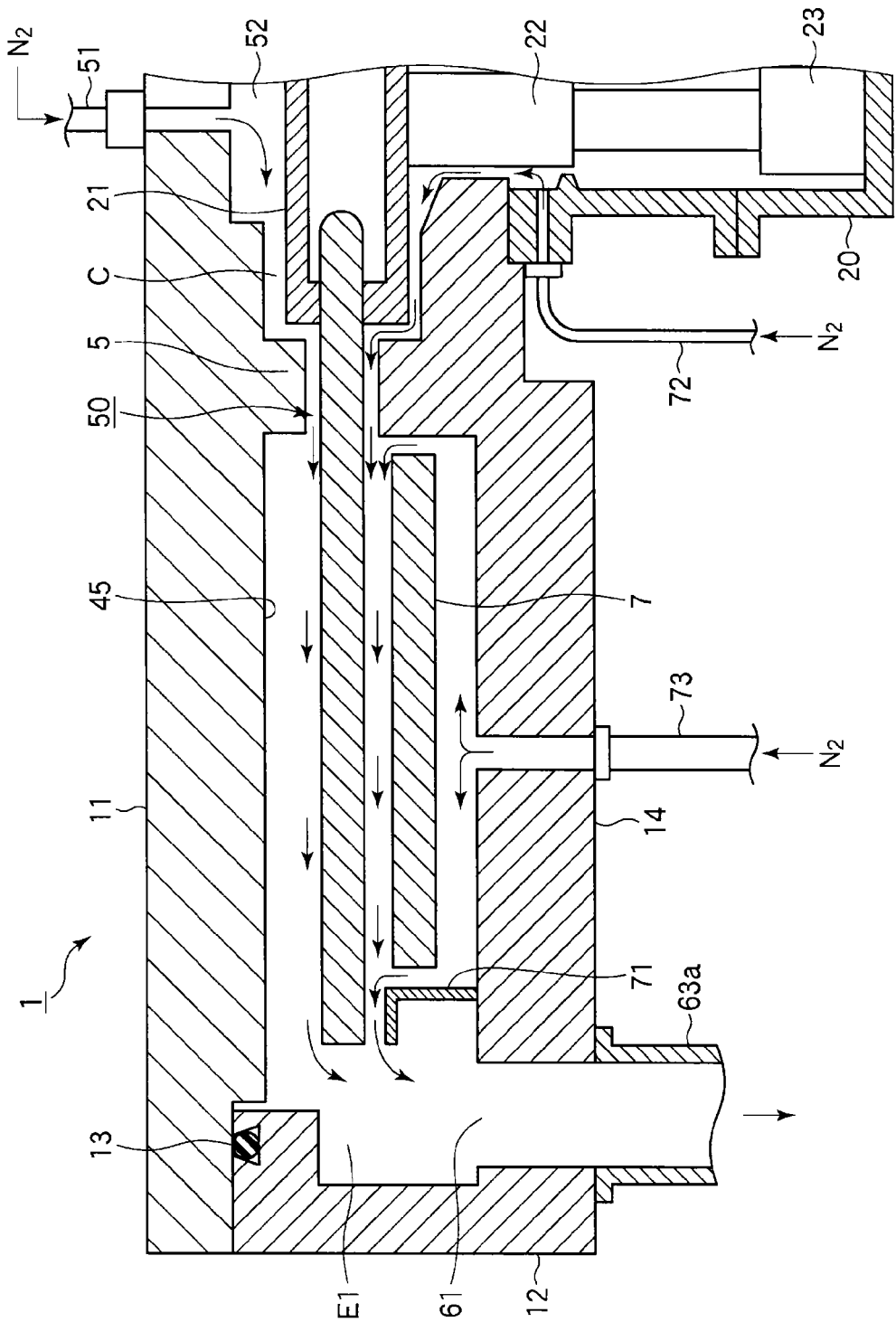
FIG. 9 is a schematic view showing purge gas flows inside the film formation apparatus.

As shown in FIG. 9, a heater unit 7 is disposed in a space between the rotary table 2 and the bottom plate 14 of the vacuum container 1 to heat the wafers W on the rotary table 2 to a temperature prescribed in a process recipe. The heater unit 7 serves as a temperature adjusting mechanism for adjusting the temperature of the wafers W to a temperature at which the first reactive gas (BTBAS gas) is adsorbed and condensed. The heater unit 7 is surrounded by a cover member 71 all around, which extends upward from the bottom plate 14 of the vacuum container 1 at a position near the peripheral edge of the rotary table 2 to separate the atmosphere where the heater unit 7 is disposed from the atmosphere of the space on the rotary table 2 and the exhaust area E. The upper side of the cover member 71 is bent outward to form a flange that defines a small gap between the flange and the lower surface of the rotary table 2 to prevent outside gas from flowing into the space inside the cover member 71.

At a position closer to the rotational center than the space containing the heater unit 7 is, the bottom plate 14 has a shape that forms small gaps between the bottom plate 14 and the lower surface of the rotary table 2 and core portion 21. A through-hole for the rotary shaft 22 is formed to extend through the bottom plate 14 and to define a small gap between its inner peripheral surface and rotary shaft 22. These small gaps communicate with the space inside the casing 20. A purge gas supply line 72 is connected to the casing 20 to supply $N_2$ gas serving as a purge gas into the small gaps. Further, purge gas supply lines 73 are connected to the bottom plate 14 of the vacuum container 1 at a plurality of positions in an annular direction below the heater unit 7 to purge the space containing the heater unit 7.

As shown with arrows indicating flows of the purge gas in FIG. 9, $N_2$ gas supplied from the purge gas supply lines 72 and 73 purges the spaces including the space inside casing 20 to the space containing the heater unit 7. The purge gas is exhausted through the gap between the rotary table 2 and cover member 71 and the exhaust areas E into the exhaust ports 61 and 62. Consequently, the BTBAS gas, $O_2$ gas, and ethanol gas are prevented from flowing from the first process area 91 or second process area 92 into the other area 92 or 91 through the spaces below the rotary table 2. Accordingly, the purge gas serves as a separation gas as well.

A separation gas supply line 51 is connected to the center of the top plate 11 of the vacuum container 1 to supply $N_2$ gas serving as a separation gas into the space 52 between the top plate 11 and core portion 21. The separation gas supplied into the space 52 is delivered from a small gap 50 between the annular protrusion 5 and rotary table 2 toward the peripheral edge of the rotary table 2 along the wafer mount surface of the rotary table 2. The space surrounded by the annular protrusion 5 is filled with the separation gas, and so the BTBAS gas is prevented from being mixed with the $O_2$ gas and ethanol gas through the center portion of the rotary table 2 between the first process area 91 and second process area 92. In other words, the film formation apparatus includes a central area C defined by the portion of the rotary table 2 near the rotational center and the vacuum container 1 to separate the atmosphere of the first process area 91 and the atmosphere of the second process area 92 and auxiliary area 90 from each other. The central area C includes a delivery port formed in the rotational direction, which is purged with the separation gas and delivers the separation gas onto the surface of the rotary table 2. This delivery port is defined by the small gap 50 between the annular protrusion 5 and rotary table 2.

Figure 10:
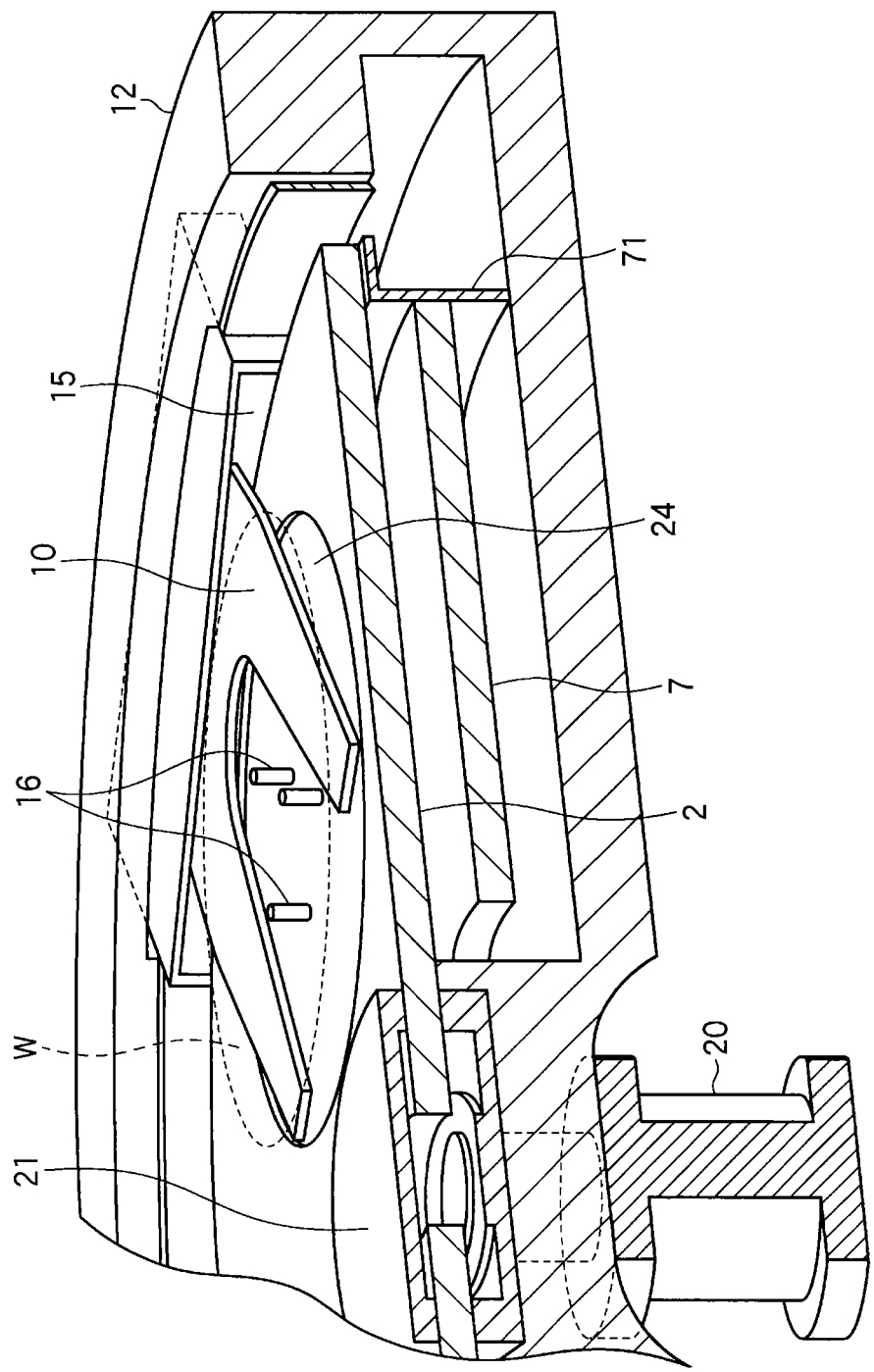
FIG. 10 is a perspective view showing a partially sectional perspective view showing the film formation apparatus.

Further, as shown in FIGS. 2 and 10, the sidewall of the vacuum container 1 has a transfer port 15 formed therein to transfer each of the wafers W between an outside transfer arm 10 and the rotary table 2. The transfer port 15 is opened and closed by a gate valve 15G. When each of the dimples 24 of the rotary table 2 serving as wafer mount places is set at a position in front of the transfer port 15, a wafer W is transferred by the transfer arm 10 to and from this one of the dimples 24. An elevating mechanism (not shown) for the lifter pins 16 is disposed below the rotary table 2 at a position facing the transfer port 15, wherein the lifter pins extend through each of the dimples 24 and support one wafer W from below.

As shown in FIG. 1, the film formation apparatus includes a control section 80 comprising a computer, which controls the operation of the apparatus as a whole, and a storage section 85 that stores process programs and so forth. The memory of the control section 80 includes areas for respective recipes, each of which stores process conditions, such as the flow rates of the BTBAS gas, ethanol gas, and $N_2$ gas supplied from the nozzles 31, 200, 41, and 42; the process pressure inside the vacuum container 1; the electric current values applied to the heating portion 42f, heater unit 7, plasma injector 250, and heating lamp 210 (the wafer W heating temperature, the $N_2$ gas supply temperature, and so forth). Each of the process programs includes instructions to retrieve a certain recipe from the memory and to send control signals to respective portions of the film formation apparatus in accordance with the recipe, so as to process the wafers W by performing steps as described later. The programs are installed into the control section 80 from the storage section 85, which is formed of a storage medium, such as a hard disk, compact disk, magneto-optical disk, memory card, or flexible disk.

Next, an explanation will be given of some of the functions of the first embodiment, with reference to FIGS. 11 to 14. At first, a wafer W subjected to thin film formation in this film formation apparatus will be described. The wafer W includes a plurality of depressed portions 230, such as grooves, formed in parallel with each other on the surface.

Figure 11:
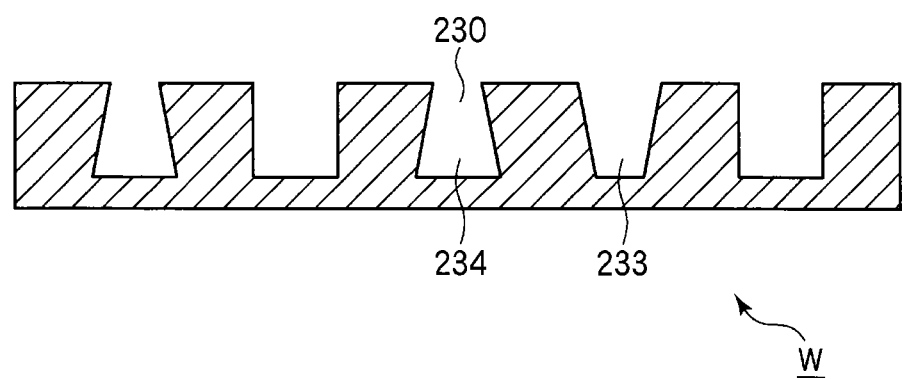
FIG. 11 is a schematic view showing a cross section of a substrate to be subjected to a film formation process in the film formation apparatus.
Figure 12:
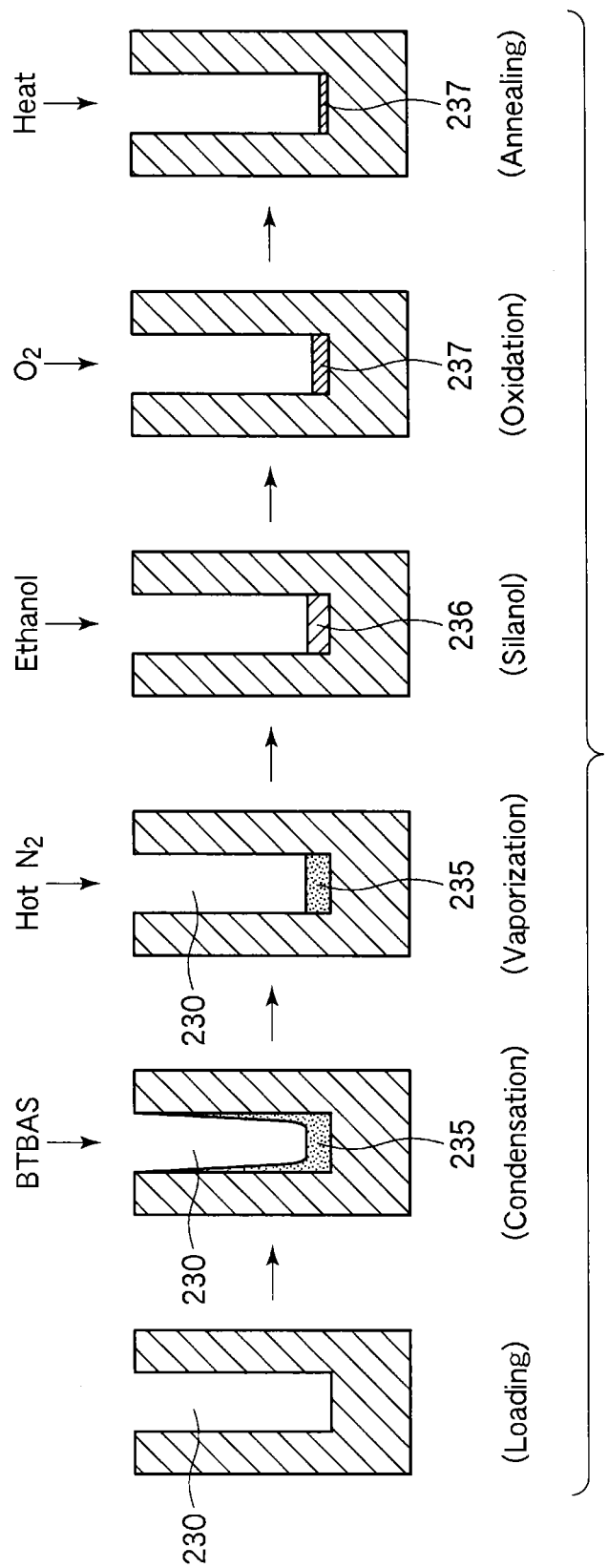
FIG. 12 is a schematic view showing progress of a film formation process on a substrate in the film formation apparatus.

FIG. 11 shows a cross section of part of the surface of the wafer W with depressed portions 230 formed therein. The depressed portions 230 have an aspect ratio of about 3 to 50. For example, the depressed portions (pattern) 230 are used for forming STI (shallow trench isolation) structures. In practice, for example, an insulating film consisting of, e.g., silicon nitride is formed inside the depressed portions 230 on an Si substrate. For example, this pattern is formed by photolithography using a mask layer laminated on the wafer W. Due to process errors or the like in the photolithography, the depressed portions 230 may include a tapered portion 233 in which the upper opening width is larger than the bottom width and a reversely tapered portion 234 in which the upper opening width is smaller than the bottom width. FIG. 11 shows such fluctuations in the shape of the depressed portions 230 in an exaggerated state.

The wafer W is subjected to the film formation process, as follows. At first, the gate valve 15G is opened, and the wafer W is loaded by the transfer arm 10 from outside the film formation apparatus through the transfer port 15 onto one of the dimples 24 of the rotary table 2. At this time, in a state where one of the dimples 24 is stopped in front of the transfer port 15, the wafer W is transferred by the transfer arm 10 to a position above the lifter pins 16, and is then received by the lifter pins 16 moving up. Then, the transfer arm 10 is retreated out of the vacuum container 1 and the lifter pins 16 are moved down, so that the wafer W is placed on this one of the dimples 24. Such loading of one wafer W is repeatedly performed while the rotary table 2 is intermittently rotated, so that wafers W are respectively placed on the five dimples 24 of the rotary table 2. Then, the gate valve 15G is closed to make an airtight state inside the vacuum container 1. Then, the rotary table 2 is rotated clockwise at a predetermined rotational speed of, e.g., 1 to 240 rpm. Further, the valve 65 is opened at full opening to vacuum-exhaust gas from inside the vacuum container 1 and the heater unit 7 is operated to adjust the temperature of the wafers W at a set value. The set temperature is predetermined to be not higher than the condensation temperature of the first reactive gas (BTBAS gas). BTBAS gas is condensed and liquefied at a temperature of about 50 to 100° C. in the vacuum container 1 having a vacuum pressure of about 1 to 8 Torr. In this embodiment, the wafers W are adjusted to have a temperature of, e.g., about 50 to 100° C., which is not higher than the condensation temperature of the BTBAS gas.

On the other hand, $O_2$ gas is supplied into the plasma injector 250 at a flow rate of, e.g., 3,000 sccm, and an RF power is supplied from the RF power supply 275 to the plasma generation area 290 (electrodes 273). Consequently, the $O_2$ gas supplied into the gas activating cell 253 is turned into plasma (activated) by the RF power and supplied through the gas delivery holes 291 toward the wafers W placed in the vacuum atmosphere inside the vacuum container 1. Further, at this time, electricity is supplied to the heating lamp 210 such that, when each of the wafers W is passing directly below the heating lamp 210, only the uppermost surface of this wafer W is heated to a temperature of 350° C. or higher.

Then, while the opening degree of the valve 65 is adjusted to set the inside of the vacuum container 1 at a predetermined vacuum, BTBAS gas heated to a temperature of, e.g., 100 to 150° C. is supplied from the reactive gas nozzle 31 into the vacuum container 1 at a predetermined flow rate of, e.g., 200 sccm. Further, ethanol gas is supplied from the auxiliary nozzle 200 into the vacuum container 1 at a predetermined flow rate of, e.g., 100 sccm. Further, $N_2$ gas is supplied from the separation gas nozzles 41 and 42 into the vacuum container 1 at predetermined flow rates of, e.g., 10 slm and 10 slm, respectively. Further, $N_2$ gas is also supplied from the separation gas supply line 51 and purge gas supply line 72 into the central area C and the narrow gaps described above at predetermined flow rates. At this time, the second separation gas nozzle 42 supplies the $N_2$ gas heated by the heating portion 42f to a temperature of, e.g., about 100 to 200° C., at which the BTBAS gas condensed substance is partly vaporized. On the other hand, the first separation gas nozzle 41 supplies the $N_2$ gas at, e.g., room temperature.

Figure 13A:
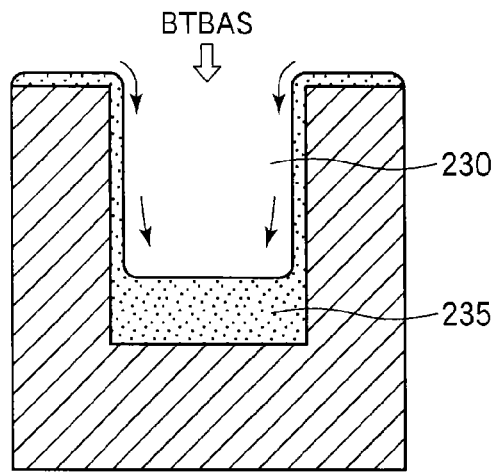
FIGS. 13A, 13B, and 13C are schematic views showing progress of a film formation process on a substrate in the film formation apparatus.

As described above, each of the wafers W is maintained at the set temperature of 50 to 100° C., when it passes through the first process area 91. In this state, the BTBAS gas heated to a temperature of 100 to 150° C. higher than the wafer temperature is supplied from the reactive gas nozzle 31. Since the wafer surface is set at a temperature not higher than the BTBAS gas condensation temperature, the BTBAS gas is cooled and condensed by the wafer surface when it comes into contact with the wafer surface (condensation step, see FIG. 12). At this time, as shown in FIG. 13A, the BTBAS gas is adsorbed and condensed also on the entrance surface and sidewall of the depressed portions 230. However, liquefied BTBAS 235 tends to move downward by gravitation from the entrance surface and sidewall. Consequently, the liquefied BTBAS 235 is condensed more on the bottom of the depressed portions 230 than on the entrance surface and sidewall.

Then, this wafer W passes below the second separation gas nozzle 42 and, at this time, the $N_2$ gas (hot $N_2$ gas) heated to 100 to 200° C. is supplied onto the surface of the wafer W. When the heated $N_2$ gas is supplied onto the BTBAS 235 condensed on the surface of the wafer W, the liquid BTBAS, i.e., BTBAS condensed substance is partly vaporized by heating (vaporization step).

Figure 13B:
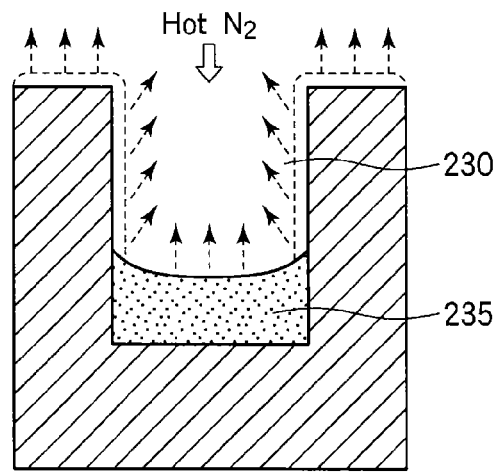
Figure 13C:
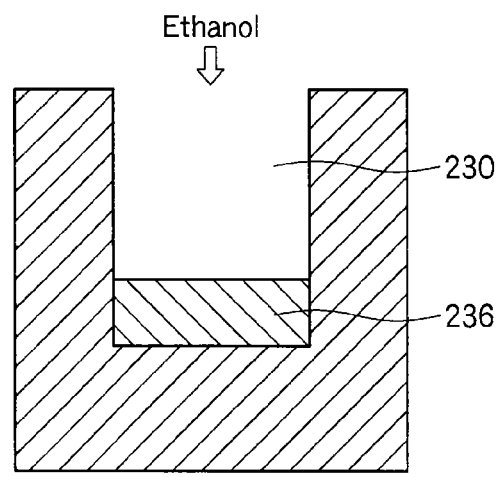

As described above, since the depressed portions 230 have the condensed substance of the liquefied BTBAS 235 more on the bottom than the other portions, that part of the condensed BTBAS 235 on the entrance surface and sidewall is vaporized and removed by the $N_2$ gas heating. On the other hand, as shown in FIG. 13B, that part of the condensed BTBAS 235 on the bottom is not sufficiently vaporized but is left thereon. This can be regarded as selective deposition of condensed BTBAS 235 on the bottom of the depressed portions 230.

As described above, in the vaporization step, the parts of the BTBAS deposits (the condensed substance) on the surface other than the depressed portions 230 and the sidewall of the depressed portions 230 are all dispersed, while the part thereof on the bottom of the depressed portions 230 remains. However, there may be a case where the parts of the BTBAS deposits on the portions other than the bottom are not entirely dispersed but are partly left, depending on the heating temperature and/or heating time. In any case, it is preferable that the BTBAS deposits are left on the bottom of the depressed portions 230 as much as possible while they are vaporized on the portions other than the bottom as far as possible. Where the first reactive gas is chemically adsorbed on the surface of the wafer W, the reactive gas is not completely dispersed in the vaporization step, and at least one molecular layer of the reactive gas is adsorbed on the sidewall of the depressed portions and the surface of the wafer W other than the depressed portions.

Then, this wafer W passes through the auxiliary area 90 and, at this time, ethanol gas adjusted at a temperature of, e.g., 50 to 100° C. is supplied onto the surface of the wafer W. The ethanol gas serves as the auxiliary gas for transforming the condensed substance (liquefied gas) of the BTBAS gas adsorbed on the wafer W as described above into an intermediate product that is less volatile than the condensed substance.

Specifically, when the ethanol gas is supplied, the BTBAS inside the depressed portions 230 causes a reaction in accordance with a reaction formula (1) (it is turned into a silanol), and generates t-butylamine ($CH_3C—NH_2$) and siloxane polymer ($—(Si—O)_n—$) 236, the latter as the intermediate product.

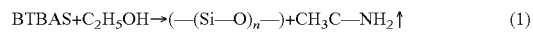

$$BTBAS + C_2H_5OH \rightarrow (—(Si—O)_n—) + CH_3C—NH_2 \uparrow \quad (1)$$

The siloxane polymer 236 is a cluster product including a hydroxyl group, which is less volatile than the BTBAS gas condensed substance. In this way, the BTBAS adsorbed inside the depressed portions 230 is fixed not to be vaporized (silanol formation step). Further, organic matters generated along with the siloxane polymer 236 are vaporized and removed upward from the wafer W, for example.

Then, this wafer W passes the second process area 92 below the plasma injector 250 and, at this time, the surface of the wafer W is irradiated with $O_2$ gas plasma (activated $O_2$ gas). The siloxane polymer 236 on the surface of the wafer W is oxidized by the oxygen plasma, and so a silicon oxide film ($SiO_2$ film) 237, which is a reaction product containing silicon and oxygen, is formed with a film thickness of, e.g., 0.1 nm (oxidation step).

Since the wafer W is adjusted at a temperature not higher than the BTBAS gas condensation temperature, the oxidation reaction of the siloxane polymer cannot proceed, even if $O_2$ gas or ozone ($O_3$) gas is supplied in an ordinary method. In this embodiment, the $O_2$ gas is activated by the plasma injector 250 and supplied onto the surface of the wafer W, so that it reacts with the BTBAS condensed substance to sufficiently promote the oxidation reaction of the BTBAS condensed substance even at the low temperature of the wafer W. Further, contaminants, such as organic matters, generated along with the silicon oxide film 237 are vaporized and exhausted upward from the wafer W, for example. In addition, the $O_2$ plasma radiated onto the silicon oxide film 237 serves to remove contaminants from inside the silicon oxide film 237 and to compact the silicon oxide film 237.

Thereafter, this wafer W passes through the area below the heating lamp 210 and, at this time, radiation heat is supplied from the heating lamp 210 onto the wafer W to perform an annealing process for reforming the reaction product or silicon oxide film 237. At this time, the uppermost surface layer of the wafer W is rapidly heated to, e.g., 350° C., and the moisture and carbon components left in the silicon oxide film 237 formed in this cycle are thereby vaporized and removed. In this way, the silicon oxide film 237 is subjected to so-called baking that enhances the bonds in the film 237 and thereby compacts the film 237. At this time, even if contaminants, such as organic matters are present in the silicon oxide film 237, they are vaporized by this annealing process, separated from the silicon oxide film 237, and exhausted.

Then, this wafer W is moved downstream from the area below the heating lamp 210 and, at this time, $N_2$ gas set at, e.g., room temperature is blown from the first separation gas nozzle 41 to the surface of the wafer W to decrease the temperature of the uppermost surface layer of the wafer W. At this time, as described above, the condensed BTBAS is preferentially present on the bottom of the depressed portions 230 due to the condensation step and vaporization step, and so the thickness of the silicon oxide film becomes larger on the bottom of the depressed portions than on the substrate surface and the sidewall of the depressed portions.

Figure 14:
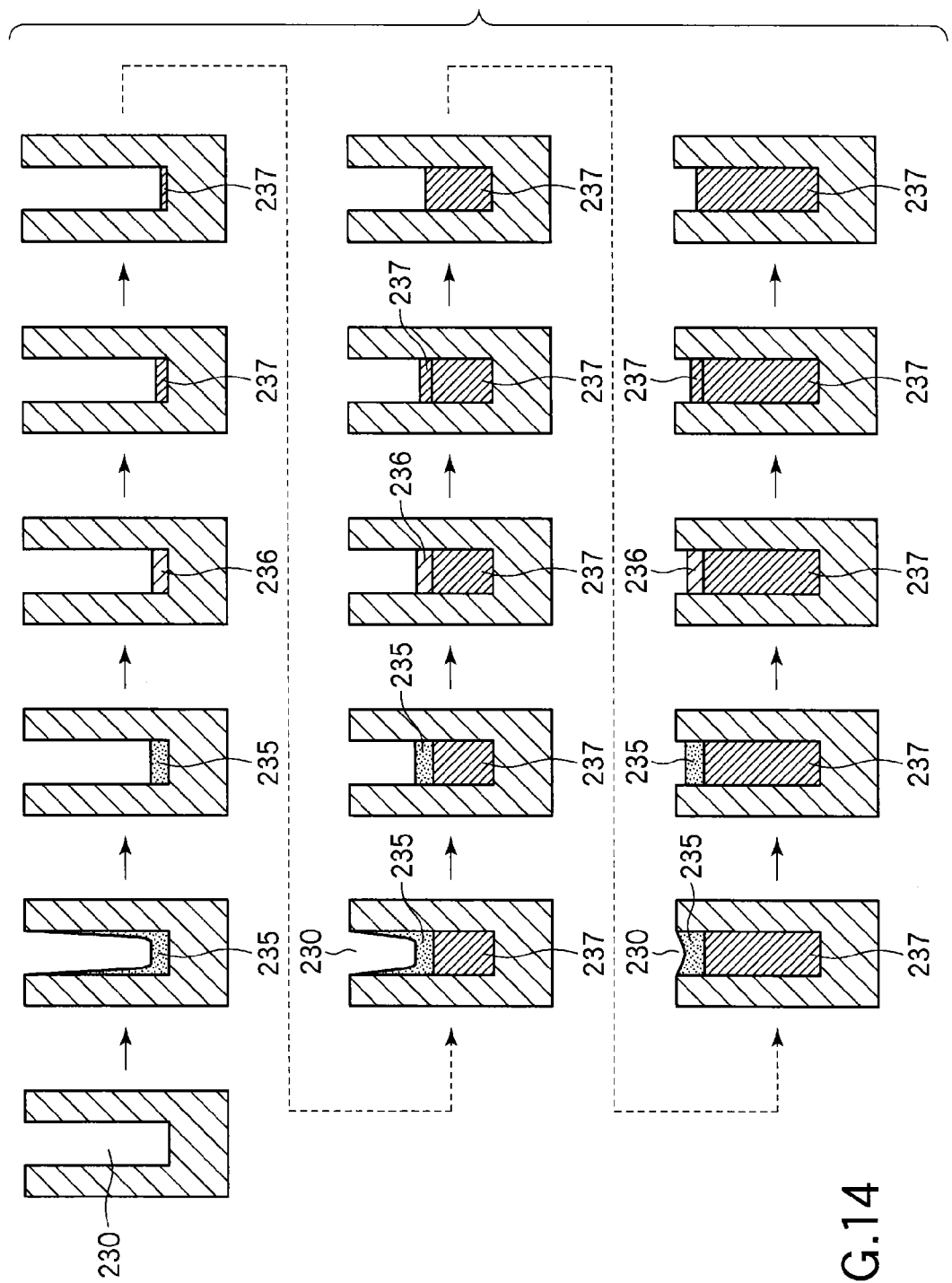
FIG. 14 is a schematic view showing progress of a film formation process on a substrate in the film formation apparatus.

As described above, the rotary table 2 is rotated to repeatedly perform the BTBAS condensation (condensation step), BTBAS re-vaporization (vaporization step), siloxane polymer generation (silanol formation step), reaction product (silicon oxide film 237) formation (oxidation step), and silicon oxide film 237 reformation (annealing step), so as to deposit a film from the bottom of the depressed portions 230. The rotation (cycle) of the rotary table 2 is repeated a number of times, such as 20 times, and the film is formed like to raise the bottom level of the depressed portions 230. Consequently, as shown in FIG. 14, the depressed portions 230 are filled with the silicon oxide film 237.

While the cycle is being repeated, when each of the wafers W passes below the heating lamp 210, the temperature of the surface of the wafer W is temporarily increased. However, when the wafer W passes through the first separation area D1, the surface of the wafer W is cooled by the $N_2$ gas set at room temperature supplied onto the surface of the wafer W. Accordingly, when the wafer W reaches the first process area 91, the temperature of the wafer W has already been adjusted to a temperature of, e.g., 50 to 100° C., which is not higher than the BTBAS gas condensation temperature.

As described above, the reaction product or silicon oxide film 237 is gradually formed cycle by cycle from the bottom of the depressed portions 230 because of the preferential condensation on the bottom, and so the depressed portions 230 are filled with the film without voids formed therein. At this time, no problems arise even where the depressed portions 230 include a tapered portion 233 in which the upper opening width is larger than the bottom width and a reversely tapered portion 234 in which the upper opening width is smaller than the bottom width. This is so, because the liquefied BTBAS 235 moves downward by gravitation along the taper, and the depressed portions 230 is filled with the film gradually formed from the bottom without voids formed therein. Further, as regards contaminants in the silicon oxide film 237, since the silicon oxide film 237, which may contain contaminants, formed by one cycle is very thin, the contaminants are swiftly removed by the oxygen plasma irradiation and annealing process.

Thus, regardless of the shape of the depressed portions, silicon oxide films are gradually laminated from the bottom and fill the depressed portions, thereby preventing formation of voids, which are a problem for conventional CVD methods. Further, contaminants in the films are decreased every cycle, and so a silicon oxide film of high quality is formed.

Figure 15:
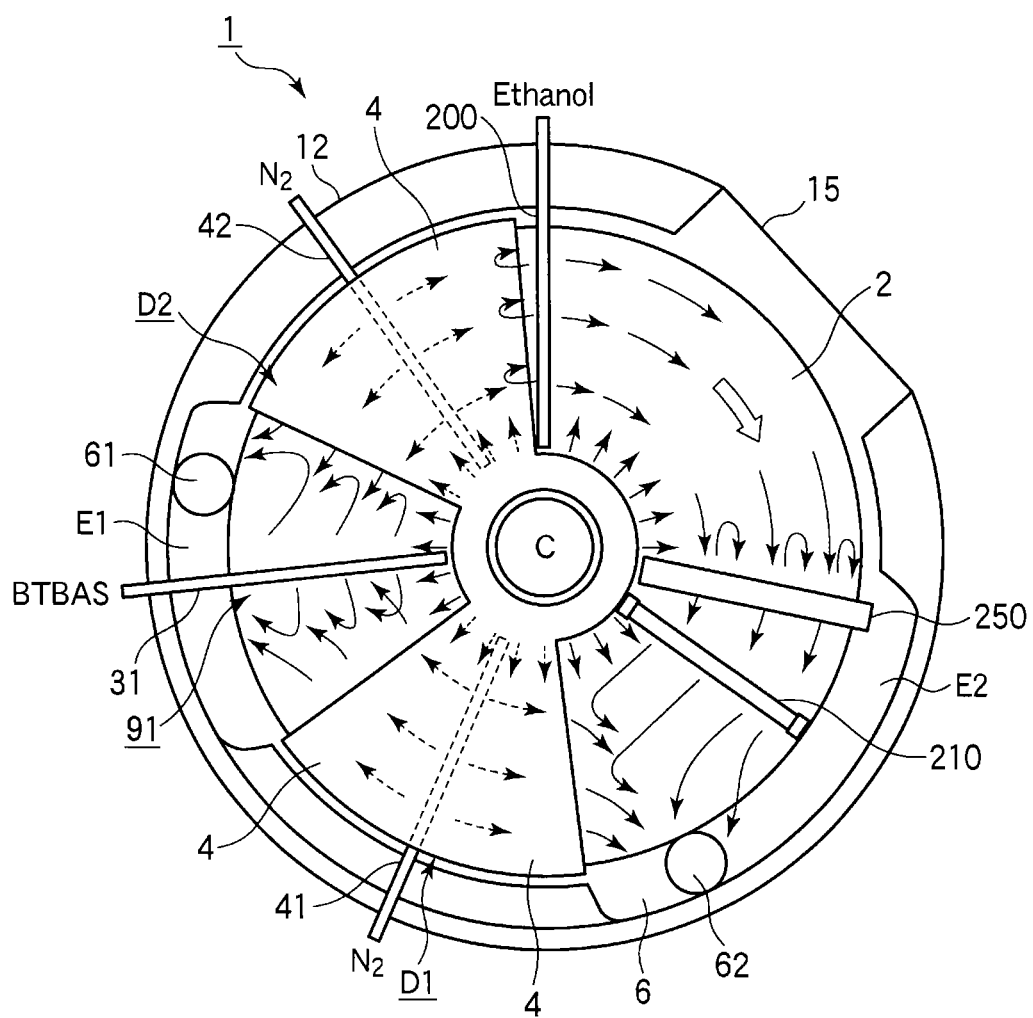
FIG. 15 is a schematic view showing gas flows inside the film formation apparatus.

In the sequence of the steps described above, $N_2$ gas is supplied at areas between the first process area 91 and the auxiliary area 90 and second process area 92. Further, $N_2$ gas serving as a separation gas is supplied into the central area C. Consequently, as shown in FIG. 15, the BTBAS gas and the ethanol gas and $O_2$ gas are exhausted while they are prevented from being mixed with each other. Further, the separation areas D1 and D2 are arranged such that the gap between each of the bent portions 46 and the outer end face of the rotary table 2 is narrow as described above, and so the BTBAS gas is not mixed with the ethanol gas and $O_2$ gas through the outside of the rotary table 2. Accordingly, the atmosphere of the first process area 91 is completely separated from the atmosphere of the auxiliary area 90 and second process area 92, and the BTBAS gas is exhausted to the exhaust port 61 while the ethanol gas and $O_2$ gas are exhausted to the exhaust port 62. Consequently, the BTBAS gas is not mixed with the ethanol gas and $O_2$ gas in these atmospheres.

In this embodiment, as described above, the inner peripheral wall of the container main body 12 is recessed outward below the second ceiling surfaces 45 near the first and second process areas 91 and 92 to additionally provide the first and second exhaust areas E1 and E2. The exhaust ports 61 and 62 are present in these additional areas, and so the pressure in the space below the second ceiling surfaces 45 is lower than those in the narrow space below the first ceiling surfaces 44 and in the central area C. Further, since the space below the rotary table 2 is purged by $N_2$ gas, the gases flowing into the exhaust areas E are prevented from flowing through the space below the rotary table 2 into other areas, such that the BTBAS gas is prevented from flowing into the $O_2$ gas supply area.

Consequently, there is no vapor phase reaction caused between the BTBAS gas and the ethanol and $O_2$ gas inside the vacuum container 1, and so it is possible to make generation of reaction by-products very small and thereby to suppress problems concerning particle generation.

The rotary table 2 includes the dimples 24, for respectively placing wafers W therein, at five positions arrayed in the rotational direction of the rotary table 2, so that the wafers W passes through the areas 91, 90, and 92 in this order. Accordingly, the wafers W may be supplied with the ethanol gas and/or activated $O_2$ gas, or heated by the heating lamp 210, before the BTBAS gas is adsorbed thereon. However, these states do not specifically adversely affect the film formation.

After the film formation process is finished, the supply of the gases is stopped and the interior of the vacuum container 1 is vacuum-exhausted. Then, the rotation of the rotary table 2 is stopped, and the wafers W are sequentially unloaded from the vacuum container 1 by the transfer arm 10 in operations reverse to those of loading.

Second Embodiment

Figure 16:
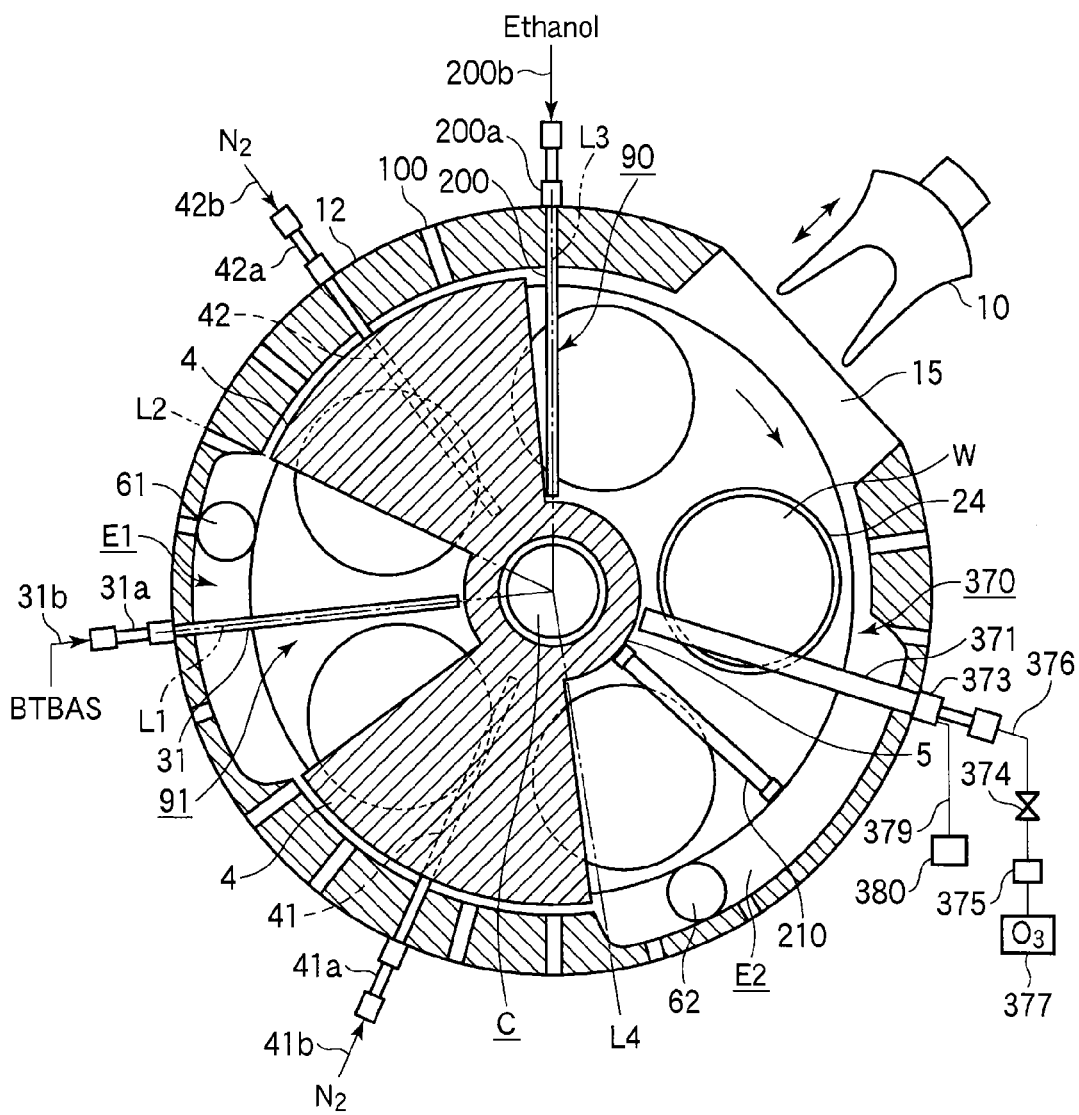
FIG. 16 is a sectional plan view showing a film formation apparatus according to a second embodiment of the present invention.
Figure 17A:
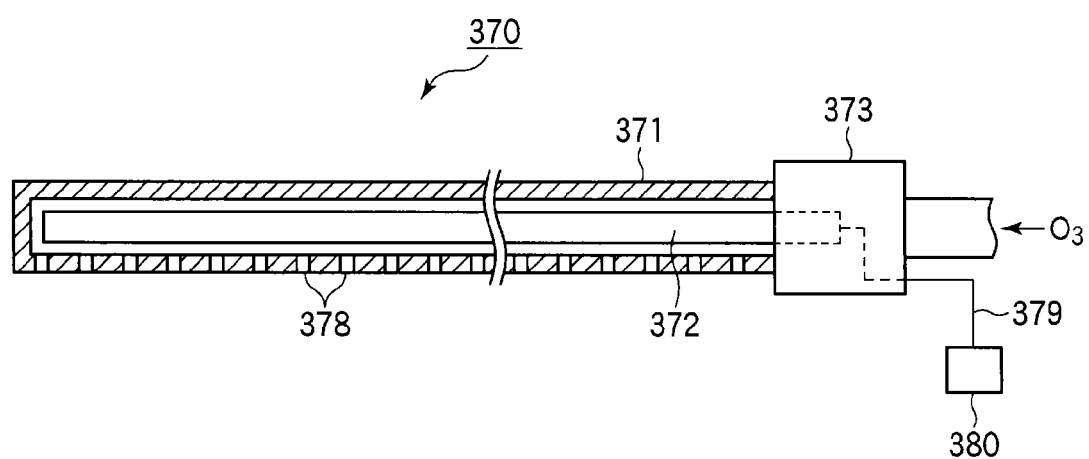
FIGS. 17A and 17B are a sectional side view and a sectional front view showing an ozone activation injector used in the alternative embodiment.
Figure 17B:
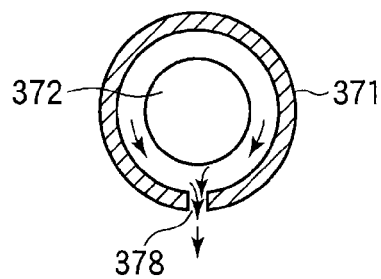

Next, an explanation will be given of the second embodiment, with reference to FIGS. 16, 17A, and 17B. In this embodiment, an ozone activating injector 370 is used in place of the plasma injector 250 as the second reactive gas supply means. The ozone activating injector 370 is disposed to extend in a radial direction of the rotary table 2. As shown in FIGS. 17A and 17B, the injector 370 includes a gas nozzle 371 for supplying ozone gas and a ceramic heater 372 disposed inside the gas nozzle. The gas nozzle 371 horizontally and linearly extends above the wafers W from the sidewall of the vacuum container 1 toward the rotational center of the rotary table 2, as in the reactive gas nozzle 31 and so forth. This nozzle includes a gas introducing portion 373 at the proximal end attached outside the sidewall of the vacuum container 1. The gas nozzle 371 is connected to a supply source 377 of the second reactive gas or ozone ($O_3$) gas by a gas supply line 376 equipped with a valve 374 and a flow rate regulator 375.

The gas nozzle 371 has a plurality of gas delivery holes 378 formed therein and facing right below to deliver the reactive gas downward. The gas delivery holes 378 have a bore diameter of e.g., 0.5 mm and are arrayed at regular intervals, such as 10 mm, over the nozzle longitudinal direction (a radial direction of the rotary table 2).

The long cylindrical heater 372 made of, e.g., a ceramic is disposed inside the gas nozzle 371 such that it extends coaxially through the gas nozzle 371 from its proximal end to the distal end. The heater 372 and the inner wall of the gas nozzle 371 form a gap of, e.g., about 1 mm therebetween, in which $O_3$ gas is introduced. Further, the proximal end of the heater 372 is connected to a power supply 380 through an electric supply line 379.

The heater 372 is configured to heat the $O_3$ gas supplied into the gas nozzle 371 to a temperature for generating $O_3$ radicals, such as about 250° C. The $O_3$ gas supplied into the gas nozzle 371 flows through the gap inside the gas nozzle 371, while it is heated to a temperature of, e.g., about 250° C. by the heater 372, and generates $O_3$ radicals. The $O_3$ radicals thus generated are supplied from the delivery holes 378 onto the wafers W on the rotary table 2.

As described above, in this embodiment, the $O_3$ gas is pre-heated to a temperature of, e.g., about 250° C., and $O_3$ radicals thereby generated are supplied onto the wafers W. Consequently, the oxidation reaction of the siloxane polymer is efficiently promoted even if the temperature of the wafers W is set at about 50 to 100° C., which is lower than the $O_3$ activation point.

Third Embodiment

Figure 18:
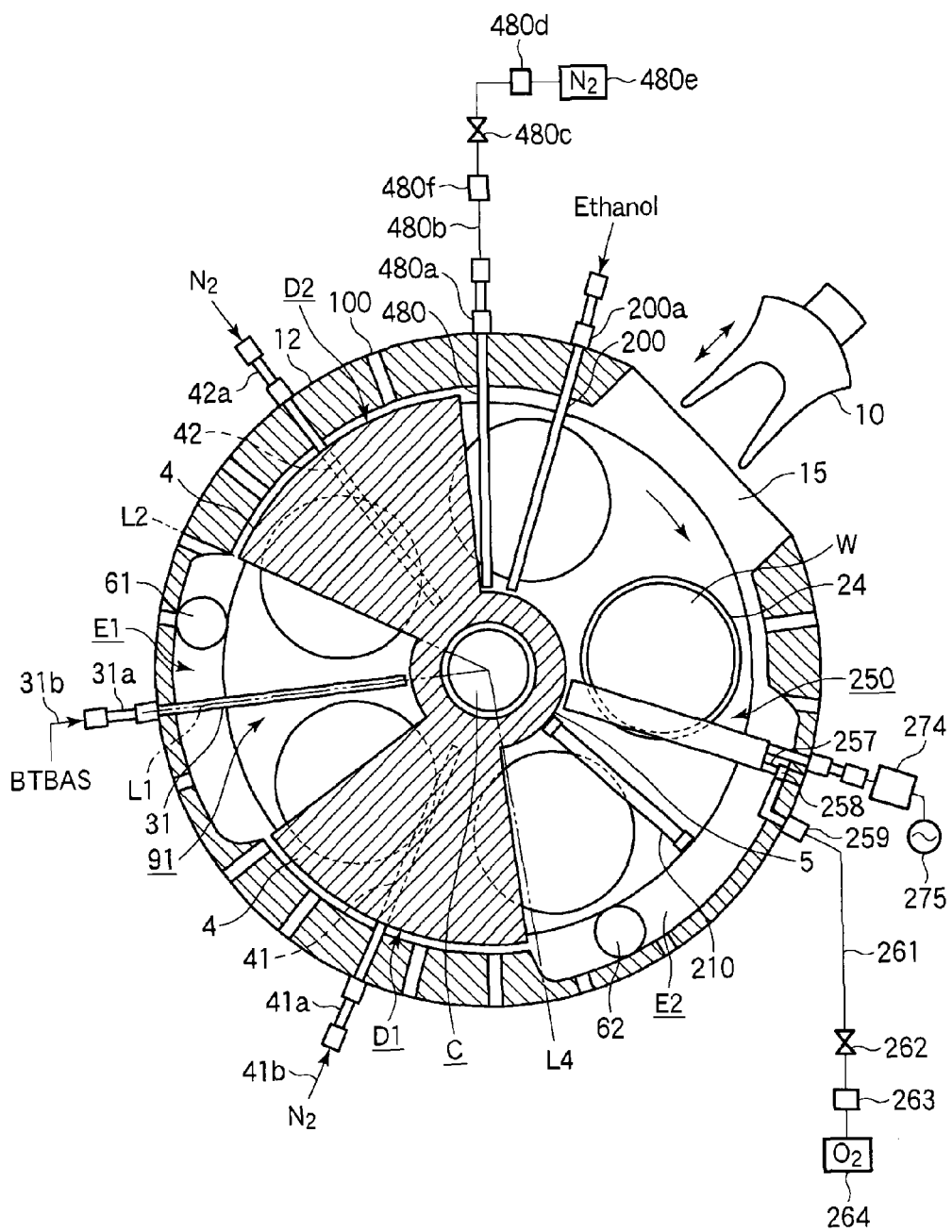
FIG. 18 is a sectional plan view showing a film formation apparatus according to a third embodiment of the present invention.

Next, an explanation will be given of the third embodiment, with reference to FIG. 18. In this embodiment, in addition to the separation gas nozzles 41 and 42, a heating gas nozzle 480 is disposed to supply a heating gas, such as heated $N_2$ gas, onto the surface of the wafers W. In this embodiment, the heating gas nozzle 480 is present between the second separation area D2 and auxiliary gas nozzle 200, and has the same structure as the second separation gas nozzle 42 described above. FIG. 18 shows a coupler 480a, a gas supply line 480b, a valve 480c, a flow rate regulator 480d, an $N_2$ gas supply source 480e, and a heating portion 480f. Where the heating gas nozzle 480 is arranged as in this embodiment, there is no need for the gas supply line 42b of the second separation gas nozzle 42 to supply a heated separation gas. Accordingly, in this embodiment, the separation gas nozzle 42 supplies the separation gas set at, e.g., room temperature. The location of the heating gas nozzle 480 is not limited to the example described above, and the nozzle 480 may be located at a position downstream or upstream from the second separation gas nozzle 42, as long as it is present between the reactive gas nozzle 31 and auxiliary gas nozzle 200.

[Modifications]

In the embodiments described above, the auxiliary gas supplied from the auxiliary gas nozzle 200 is ethanol gas. The auxiliary gas may be another alcohol, such as methanol ($CH_3OH$), purified water ($H_2O$), or hydrogen peroxide solution ($H_2O_2$). In other words, the auxiliary gas can be a compound gas including hydroxyl group (OH group). For example, where the auxiliary gas is purified water, the purified water gas reacts with the BTBAS gas condensed on the surface of the wafer W to form a silanol in accordance with a reaction formula (2), for example.

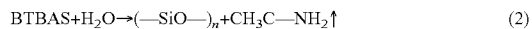  (2)

The intermediate product, $(—SiO—)_n$, generated by this reaction is a product less volatile than the BTBAS condensed substance, as in the siloxane polymer described above.

In the present invention, the silanol formation step is not necessarily required. The liquefy BTBAS preferentially adsorbed on the bottom of the depressed portions 230 by the vaporization step may be subjected to an oxidation step by performing oxygen plasma irradiation or activated $O_3$ gas supply on the liquefy BTBAS. In this case, the auxiliary gas nozzle 200 is not disposed while the plasma injector 250 (or ozone gas activating injector 370) and heating lamp 210 are disposed downstream from the separation gas nozzle 42. Even in this case arranged to repeatedly perform the BTBAS gas condensation step, the vaporization step by the heated $N_2$ gas, and the oxidation step by the oxygen plasma irradiation or activated ozone gas supply, it is possible to improve characteristics for embedding a film by preferentially increasing deposition on the bottom of the depressed portions 230.

The temperature of the separation gas supplied in the first separation area D1 is not necessarily set at room temperature. This temperature merely needs to be set such that the temperature of each wafer W heated in the area below the heating lamp 210 is adjusted to be not higher than the BTBAS gas condensation temperature before the wafer W reaches the first process area 91 after it passes through the first separation area D1. In this case, the supply temperature of the separation gas is set in light of the rotational speed of the rotary table 2, the position of the reaction nozzle 31, the size of the first separation area D1, the position of the first heating lamp 210, and the wafer heating temperature by the heating lamp 210.

When the oxidation step is performed by oxygen plasma, the plasma generation gas may contain, in addition to oxygen gas, Ar gas or a gas mixture of Ar gas and $H_2$ gas. Ar gas used in this way provides the effect of forming $SiO_2$ bonds in the film and excluding SiOH bonds therefrom.

In the embodiments described above, the heating lamp 210 is kept supplied with electricity during the film formation process, so that a heating process is performed by the heating lamp 210 on the reaction product in each rotation of the rotary table 2 (each cycle). However, the heating lamp 210 may be supplied with electricity to perform a heating process after the cycle of the BTBAS gas condensation step, vaporization step, silanol formation step (which may be excluded), and oxidation step is repeated a plurality of times, such as 20 times.

In this case, after the rotary table 2 is rotated a plurality of times to laminate a plurality of reaction product layers, the supply of the gases other than the separation gas is stopped and the heating lamp 210 is turned on. In this state, the rotary table 2 is rotated once for the respective wafers W to sequentially pass below the heating lamp 210. With this operation, a film of high quality can be obtained.

As regards the ceiling surfaces 44 of the separation areas D, their portions upstream from the separation gas nozzles 41 and 42 in the rotational direction of the rotary table 2 are preferably formed such that the width in the rotational direction becomes larger at a position closer to the outer end. This is so, because the velocity of gas flows towards the separation areas D from the upstream positions becomes higher at a position closer to the outer end due to the rotation of the rotary table 2. In light of this fact, it is preferable that the projecting parts 4 have a sector shape, as described above.

The lower ceiling surfaces 44 are preferably disposed on the opposite sides of each separation gas supply means in the rotational direction. However, in place of the projecting parts 4 disposed on the opposite sides of each of the separation gas nozzles 41 and 42, the separation gas nozzles 41 and 42 may be designed such that they blow $N_2$ gas downward to form gas curtains to separate the first process area 91 and second process area 92 by the gas curtains.

The temperature adjusting mechanism for adjusting the temperature of the wafers W to a temperature, at which the first reactive gas is adsorbed and condensed, may be formed of a lamp heating unit. The temperature adjusting mechanism may be disposed above the rotary table 2 in place of the lower side, or may be disposed above and below the rotary table 2. Further, where the wafers W need to be set at a temperature below room temperature, due to the process gas type, the vacuum container 1 may be equipped with a cooling mechanism using a chiller or liquid nitrogen.

The positions of the nozzles 31, 200, 41, and 42, plasma injector 250 (ozone activating injector 370), and heating lamp 210 may be varied, as needed. They can be arranged in any fashion as long as a cycle is repeated a number of times such that the reactive gases are exhausted without being mixed with each other, the BTBAS is adsorbed and condensed on the surface of the wafer W and is then re-vaporized by the heated $N_2$ gas, and the intermediate product is generated from the BTBAS by the ethanol gas and is then oxidized by oxygen plasma or $O_3$ gas radicals.

In place of the heating lamp 210, the plasma injector 250 may be configured to reform the reaction product on the wafers W. Such a modification is effective particularly where the second reactive gas supply means is formed of an ozone activating injector. Where the plasma reformation is adopted, Si—O—Si bonds with three-dimensional bonds are formed and improve the film quality, such as the etching resistance. In this case, the plasma injector 250 serves as oxygen plasma supply means for supplying a gas containing oxygen while turning it into plasma to reform the reaction product on the wafers W.

The first reactive gas may be TEOS (tetraethoxy silane), DIPAS (diisopropylamino silane), or 3DMAS (trisdimethylamino silane), in place of BTBAS. The present invention may be applied to a case where the rotary table 2 is designed to place only one wafer W thereon.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A film formation method of performing a supply cycle of sequentially supplying at least two kinds of reactive gases, which are reactive with each other, to a surface of a substrate inside a vacuum container, and thereby laminating reaction product layers to form a thin film on the substrate, the method comprising:
    placing the substrate in an essentially horizontal state on a table inside the vacuum container, the substrate including a depressed portion formed thereon;
    adjusting a temperature of the substrate placed on the table to a temperature at which a first reactive gas is adsorbed and condensed;
    supplying the first reactive gas from a first reactive gas supply part to the substrate placed on the table, and thereby depositing a condensed substance of the first reactive gas on the substrate;
    rotating the table relative to the first reactive gas supply part;
    supplying a heated gas to the substrate to heat the substrate, and thereby partly vaporizing the condensed substance of the first reactive gas adsorbed on the substrate;
    supplying an auxiliary gas, which transforms the condensed substance of the first reactive gas adsorbed on the substrate into a derived substance less volatile than the condensed substance, to the substrate; and
    supplying a second reactive gas in an activated state to the substrate, and thereby causing the second reactive gas to react with the condensed substance adsorbed on the substrate to generate a reaction product.

2. The film formation method according to claim 1, wherein the method comprises reforming a reaction product comprising said reaction product layers on the substrate by heating the substrate.

3. The film formation method according to claim 1, wherein the method comprises reforming the reaction product on the substrate by supplying a gas containing oxygen, which has been turned into plasma, to the substrate.

4. The film formation method according to claim 1, wherein the method comprises supplying a separation gas to the substrate at separation areas that are present, in a rotational direction of the table, between a first process area for supplying the first reactive gas and a second process area for supplying the second reactive gas, and thereby preventing the first reactive gas and the second reactive gas from being mixed with each other.

5. The film formation method according to claim 1, wherein the method comprises supplying a separation gas to the substrate at separation areas that are present, in a rotational direction of the table, between a first process area for supplying the first reactive gas and a second process area for supplying the second reactive gas and the auxiliary gas, and thereby preventing the first reactive gas from being mixed with the second reactive gas and the auxiliary gas.

6. The film formation method according to claim 4, wherein the supplying the separation gas includes partly vaporizing the condensed substance of the first reactive gas adsorbed on the substrate, by supplying a heated separation gas as the heated gas to the substrate to which the first reactive gas has been supplied.

7. The film formation method according to claim 1, wherein the first reactive gas is a silicon source gas and the auxiliary gas is a gas for transforming the condensed substance into a substance containing one or both of hydroxyl group and moisture as the derived substance less volatile.

8. The film formation method according to claim 4, wherein each of the first and second separation areas includes a separation ceiling surface configured to prevent the first reactive gas and the second reactive gas from being mixed with each other by cooperation with the separation gas, and the separation ceiling surface is lower than ceiling surfaces of the first and second process areas and has a sector shape with a width thereof in the rotational direction becoming larger outward in a radial direction of the table.

9. The film formation method according to claim 1, wherein the method further comprises placing a plurality of substrates to be processed on the table side by side in a rotational direction of the table.

* * * * *